(12) United States Patent
Sugiyama

(10) Patent No.: US 6,351,457 B1
(45) Date of Patent: Feb. 26, 2002

(54) METHOD OF AND APPARATUS FOR IDENTIFYING UNKNOWN SYSTEM

(75) Inventor: Akihiko Sugiyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/188,201

(22) Filed: Nov. 9, 1998

(30) Foreign Application Priority Data

Nov. 7, 1997 (JP) .............................................. 9-306012

(51) Int. Cl.$^7$ ................................................ H04B 3/20
(52) U.S. Cl. .................................. 370/290; 379/406.08
(58) Field of Search .............................. 370/282, 286, 370/290, 291, 292; 379/406, 410, 411, 406.08, 406.09, 406.1; 708/300, 301, 319, 320, 322, 323

(56) References Cited

U.S. PATENT DOCUMENTS

| | | | | |
|---|---|---|---|---|
| 5,245,561 A | * | 9/1993 | Sugiyama | 708/322 |
| 5,867,486 A | * | 2/1999 | Sugiyama | 370/290 |
| 5,940,455 A | * | 8/1999 | Ikeda | 375/350 |
| 6,151,614 A | * | 11/2000 | Ikeda | 708/322 |

FOREIGN PATENT DOCUMENTS

| | | |
|---|---|---|
| JP | 63-246933 | 10/1988 |
| JP | 9-233003 | 9/1995 |
| JP | 9-167983 | 6/1997 |
| JP | 10-322245 | 12/1998 |

OTHER PUBLICATIONS

Proceedings of the IEEE, vol. 63, No. 12, Dec. 1975—pp. 1692–1716.
IEEE Transactions on Automatic Control, vol. AC–12, No. 3, Jun. 1967—pp. 282–287.
IEEE Transactions on Circuits and Systems–II, vol. 43, No. 9, Sep. 1996—pp. 629–636.
Japanese Patent Disclosure No. 7–202766.
IEEE Proceedings of International Conference on Acoustics, Speech and Signal Processing, vol. III, Apr. 1994—pp. 41–44.
Adaptive Signal Processing, 1985—Prentice–Hall, Inc.— pp. 100–101.
Adaptive Filtering Prediction and Control, Prentice–Hall, Inc.—pp. 348–349.

* cited by examiner

Primary Examiner—Kwang B. Yan
(74) Attorney, Agent, or Firm—Foley & Lardner

(57) ABSTRACT

For identifying an unknown system such as a transmission line or a spatial acoustical coupling, tap coefficients are arranged at taps of an adaptive filter which correspond to a part of an impulse response waveform other than a flat delay part of the impulse response, thus attaining reduction of the convergence time and residual errors without resulting in errors of tap coefficients and tap positions even when a highly nonstationary signal is received. A tap control circuit 91 includes an input signal evaluation circuit 170, which evaluates input signal samples received from delay elements $20_1$ to $20_N$, sets step sizes to zero and generate a signal for stopping tap position control according to the result of evaluation.

20 Claims, 27 Drawing Sheets

METHOD OF AND APPARATUS FOR IDENTIFYING UNKNOWN SYSTEM

BACKGROUND OF THE INVENTION

The present invention relates to methods of and apparatuses for identifying unknown systems such as transmission lines and spatial acoustical coupling.

As applications of identification of unknown systems with adaptive filters, echo cancellers, noise cancellers, hauling cancellers and adaptive equalizers are well known in the art. Pertaining prior art technique will now be described in connection with an echo canceller as an example, which cancels echo leaking from the transmitting side to the receiving side on the 4-line side of a 2-to4-wire hybrid transformer.

An echo canceller uses an adaptive filter having tap coefficients equal to more than those of the impulse response of the echo path. In operation, the echo canceller generates a psuedo echo (or echo replica) corresponding to the transmitted signal, and thus suppresses echo leaking from the transmitting circuit to the receiving circuit on the 4-line side of the 2-to4-wire hybrid transformer. Each tap coefficient of the adaptive filter is corrected by taking correlation between an error signal, obtained by subtracting the echo replica from the mixed signal including the echo and the received signal, and the transmitted signal. Typical examples of the tap coefficient adaptation algorithm of such an adaptive filter, are the LMS algorithm as disclosed in Proceedings of IEEE, Vol. 63, No. 12, December 1975, pp. 1962-1716 (Literature 1) and a learning identification method (LIM) disclosed in IEEE Transactions on Automatic Control, Vol. 12, No. 3, March 1967, pp. 282–287 (literature 2).

When a fixed delay is present between the point on the 4-line side, where the echo canceller is inserted, and the point where the hybrid transformer is located, the echo canceller requires a sufficient number of taps for covering both the maximum estimated fixed delay and the actual significant part of the impulse response. Thus, when the fixed delay is long, an enormous number of taps are necessary, thereby increasing the hardware size and the convergence time due to mutual interference of the coefficients. To solve this problem, an adaptive control method of coefficient arrangement is disclosed in IEEE Transactions on Circuits and Systems-11, "Analog and Digital Signal Processing", Vol.43, No.9, September 1996, pp. 629–636 (Literature 3). In this method, the position of the significant part of the impulse response is estimated, around which tap coefficient of the adaptive filter are adaptively located.

The gist of the method shown in Literature 3 is to roughly estimate the position of part position and arrange the tap coefficients in a limited neighborhood of the estimated position, thus reducing the convergence time. The convergence time until the taps are arranged at right positions is also reduced by dividing a queue, in which the indexes of taps without any coefficient are stored, into two queue, one corresponding to the waveform response part neighborhood and the other corresponding to the significant part and the other part than the significant part. The position of the significant is estimated from the absolute maximum value of the tap coefficients, and only a single tap coefficient arrangement range is estimated. Therefore, where a plurality of significant parts are present (these parts being collectively called multi-echo when echoes are concerned), the tap coefficient arrangement range should be expanded so as to cover all these parts. Therefore, where a long fixed delay is involved between two parts, the limiting effect on the coefficient arrangement is reduced, inevitably increasing the convergence time. To solve this problem, methods which permit fast convergence even with multi-echoes and concentration tap coefficients in the significant parts, are disclosed in Japanese Patent Disclosure No. 7-202766 (Literature 4) and IEEE Proceedings of International Conference on Acoustics, Speech and Signal Processing, Vol. III, pp. 41–44, April 1994 (Literature 5).

FIG. 24 is a block diagram showing the construction of the echo canceller proposed in Literature 4. In the adaptive filter shown in FIG. 24, (N−1) delay elements $20_1$ to $20_{N-1}$ are provided for delaying a transmitted signal supplied from a transmitted signal input terminal 1. The taps provided are N in number including the one zero delay. L (N>L) coefficient generators $30_1$ to $30_L$ are provided for generating tap coefficients of the adaptive filter. Specifically, the adaptive FIR filter shown in FIG. 24, unlike the usual adaptive FIR filters, has a sufficient number of tap coefficients for realizing the substantial waveform response part excluding the flat delay part or parts, and adaptively arranges the tap coefficients therein. A routing switch 7 is provided for switching the connection between the delay elements and the coefficient generators. A tap control circuit 9 is provided for controlling the routing switch 7. Specifically, the routing switch 7 selectively transmits the outputs of L delay elements to the coefficient generators according to the data received from an output terminal 900 of the tap control circuit 9. The routing switch 7 supplies the outputs of L delay elements with the tap coefficient generators $30_1$ to $30_L$ and also to multipliers $40_1$ to $40_L$, respectively. The multipliers $40_1$ to $40_L$ multiply tap coefficient values provided from the coefficient generators $30_1$ to $30_L$ and the delayed signals from the routine switch 7, and supplies the products to an adder 8. The adder 8 adds together the products from the multipliers $40_1$ to $40_L$ and provides the sum as an echo replica. The tap control circuit 9 supplies from its output terminals $901_1$ to $901_L$ step size, which are used for coefficient adaptation. The tap control circuit 9 also supplies coefficient-clear signals from its output terminals $902_1$ to $902_L$ to the coefficient generators $30_1$ to $31_L$ for clearing, i.e., zero resetting, the coefficients therein. Furthermore, the tap control circuit 9 receives from its input terminals $903_1$ to $903_L$ tap position control signals, and uses these signals for generating the step size and the coefficient-clear signals.

The transmitted signal supplied from the transmitted signal input terminal 1 is transmitted from a transmitted signal output terminal 2 via a transmission line to a hybrid transformer 3, is coupled to the 2-line side thereof. Due to impedance mismatch, the transmitted signal partly leaks as an echo to the receiving side. The echo from a received signal input terminal 4 is supplied to a subtracter 5. The subtracter 5 subtracts the echo replica from the adder 8, and transmits the difference result to a received signal output terminal 6. The difference is also supplied as an error signal for coefficient adaptation to the tap coefficient generators $30_1$ to $30_L$.

Assuming as the coefficient adaptation algorithm the LMS algorithm shown in "Adaptive Signal Processing", 1985, Prentice-Hall Inc., USA (Literature 6), the value $c_i(k+1)$ of i-th tap coefficient after the (k+1)-th adaptation is given, using value $c_i(k)$ after k-th adaptation, as:

$$c_i(k+1)=c_i(k)+\mu_i e(k) \times (k-a(i)) \tag{1}$$

where $\mu_i$ is the step size corresponding to the i-th coefficient, $e(k)$ is the residual echo, $x(k-a(i))$ is the input signal sample at $(k-a(i))$-th coefficient adaptation, $a(i)$ is a set of indexes to the delay elements selected by the routing switch 7, and L is the number of delay elements.

The coefficient generators $30_i$ (i being 1 to L) may have a construction as shown in FIG. 25. As shown, a multiplier 31 multiplies the error signal and the step size by each other. A multiplier 32 multiplies the product output of the multiplier 31 and delayed signal supplied from the routing switch 7. An adder 33 adds the output of the multiplier 32, which represents a coefficient correction amount, and a coefficient value stored in a memory 34. The sum result of the adder 33 is fed back to the memory 34. The memory 34 delays the input coefficient value, and thus provides an adapted coefficient value. The memory 34 function to reset the coefficient value held therein to zero when it receives a coefficient-clear signal supplied from output terminal $902_i$ (i being 1 to L) of the tap control circuit 9.

As is seen from the above description, the coefficients of the adaptive filter are coupled to only the delay elements which are selected by the routing switch 7. The taps which coefficients are coupled to, are referred to as active taps, and those without any tap coefficient coupled thereto are referred to as inactive taps. In actual adaptive coefficient arrangement, taps which are less in number than the actual total number are arranged as initial values at an uniform interval, for instance. The taps with these coefficients arranged for them in this way are active taps, and those without any coefficient arranged are inactive taps. Initially, the active taps may be arranged in the order of their indexes or randomly.

FIG. 26 is a block diagram showing the construction of the tap control circuit 9. The indexes to (N–L) inactive taps are stored in memories $110_1$ to $110_M$, respectively, which constitute an FIFO (first-in-first-out) construction having a length of N/M. The indexes to the inactive taps are stored in groups, which are obtained by uniformly dividing the total taps and each consisting of N/M taps. These groups are referred to as tap groups. In the case with a total number of 20 taps and number of 5 tap groups, the number M/M of taps belonging to each tap group is 4. Representing the number of the tap index belonging to G(n) in braces, the tap groups G(n) (n being 1 to 5) are represented as:

G(1)={1, 2, 3, 4}

G(2)={5, 6, 7, 8}

G(3)={9,10, 11, 12}

G(4)={13, 14, 15, 16}

G(5)={17, 18, 19, 206} of these indexes, those being inactive at present are stored in the corresponding memories. In the instant example, elements in group G(n) (n being 1 to 5) are stored in memory $110_n$.

For every Q coefficient adaptation, an index selecting circuit 112 selects one of the memories $110_1$ to $110_L$ according to the tap group select signal supplied from a selection order memory 150, takes the index stored atop in the selected memory, and supplies the index as a new or updated active tap index to a tap index memory 114. In the tap index memory 114, indexes to L active taps which are not stored in the memories $110_1$ to $110_L$ are stored. The tap index memory 114 supplies the active tap indexes as tap position control signal to the output terminal 900. The active tap indexes may be set initially in any order, that is, the tap index memory 114 may provide any initial index order. For example, the L indexes may be set initially in the order of their values or at random. As an example, a case will be considered, in which indexes to L taps, among the all indexes, are successively selected in the order of their values. In the example noted earlier, the indexes are arranged in the order of 1, 2, . . . , 20. Assuming that the number L of the active taps is L=3 and the number (N-L) of the inactive taps is N-L=17, three numbers of 1, 2 and 3 are selected in the order of their values as the active tap indexes, and are stored as the initial indexes in the index memory 114. The initial indexes in the memories $110_1$ to $110_L$ involve indexes other than those in the index memory 114. In the above example, the indexes 4, 5, . . . , 20 among all indexes, other than the indexes 1 to 3, are selected and stored as the initial indexes in the corresponding memories of $110_1$ to $110_L$. After the initial index setting as described above, coefficients corresponding to the active tap indexes selected by the routing switch 7 are updated. The coefficient arrangement is updated by updating active taps for every Q coefficient adaptation. Coefficient rearrangement is made in the following way.

The minimum coefficient detecting circuit 116 receives the active tap indexes supplied from the index memory 114 and the outputs of the coefficient generators, i.e., coefficients, supplied to its input terminals $903_1$ to $903_L$, and detects the active tap index corresponding to the minimum absolute valued coefficient. The detected active tap index is supplied to the index memory 114, a distributing circuit 118, an evaluation circuit 120 and a coefficient clearing circuit 122. The coefficient clearing circuit 122 generates a coefficient-clear signal for coefficient generator corresponding to the supplied tap index, and transmits this signal to a corresponding one of the output terminals $902_1$ to $902_L$. The transmitted coefficient-clear signal is supplied to the corresponding coefficient generator to clear or reset the coefficient therein to zero. The evaluation circuit 120 determines the tap group, which includes the tap index supplied from the minimum coefficient detecting circuit 116, and supplies the index to the corresponding tap group to the distributing circuit 118. The distributing circuit 118 selects a memory among the memories $110_1$ to $110_L$, which corresponds to the tap group index supplied from the evaluation circuit 120, and transmits the tap index corresponding to the minimum coefficient supplied from the minimum coefficient detecting circuit 116. The transmitted tap index is stored in a memory $110_i$ designated by the distributing circuit 118. The index memory 114 deletes, from its memory contents, the tap index supplied from the minimum coefficient detecting circuit 116, and stores the active tap index supplied from the tap index selecting circuit 112. In this way, the index memory 114 updates the stored active tap indexes.

A coefficient evaluation circuit 130 receives the coefficients supplied from the coefficient generators and the active tap indexes from the index memory 114, and calculates the sum of the absolute coefficient values for each tap group. The circuit 130 then rearranges these M sums of absolute coefficients in the order of greater values, and supplies the corresponding indexes to the tap groups in the rearranged order thereof as an "order" to a tap group selection data updating circuit 140. The coefficient evaluation circuit 130 also supplies sums of the absolute coefficient values as "coefficient sum" to the tap group selection data updating circuit 140. The tap group selection data updating circuit 140 calculates a tap group selection order according to the received data, and supplies a "selection order" representing the calculated selection tap group order to the selection order memory 150. The selection order memory 150 stores the "selected order", i.e., the tap group indexes rearranged in the order of selection, and supplies these tap group indexes successively in the selection order to the tap index selecting circuit 112. The tap group indexes may be initially set in any order in the selection order memory; for example, they may be set in the order of their values or at random. Representing the tap group indexes held in the selection order memory 150 by Z(n) (n being 1 to M), in the case of setting the tap group indexes in the order of their values as in the above example, Z(n) is initially set as:

Z(1)=1, Z(2)=2, Z(n)=3, Z(4) and Z(5)=5.

Read address pointer which prescribes the read address of the selection order memory 150 for reading data therefrom, is initially set at the forefront address thereof. That is, the forefront tap group index, i.e., Z(1)=1 in the above example, is supplied as the initial read address pointer to the tap index selecting circuit 112. According to this read address pointer, supplied as tap group selection signal, the tap index selecting circuit 112 first selects the memory $110_1$, takes out the forefront tap index stored therein, and supplies this tap index to the index memory 114. The read address pointer is updated according to an "update signal" provided from the tap group selection data updating circuit 140. Whenever an "update signal" is provided from the tap group selection data updating circuit 140, the selection order memory 150 increments the read address pointer designating a stored tap group index by one.

The coefficient evaluation circuit 130 takes the absolute values of the supplied coefficients, and sums up these absolute values for each tap group. The coefficient evaluation circuit 130 further calculates the ratio of the maximum value $C_{max}$ among the sums of absolute coefficient values for each tap group to each sum. Denoting the absolute coefficient values for the j-th tap group by $C_{j,max}$ (M being the number of the tap groups and $1 \leq j \leq M$), the ratio is calculated as $R_j = C_{j,max}/C_{max}$. The calculated ratio is supplied to a step size generator 160. The same result as above is also obtainable by defining the sum of absolute coefficient value in all tap groups as $C_{max}$. The step size generator 160 generates step sizes according to $R_j$ supplied from the tap coefficient evaluation circuit 130, the generated step size being transmitted to the corresponding output terminal $901_i$ (i being 1 to L). The step size $\mu_j$ is obtained as the product $\mu_j = \mu \times R_j$ of $R_j$ and a predetermined constant. The mapping between j and i ($1 \leq i \leq L$) is calculated according to the tap position control signal supplied from the index memory 114 such that the step size used for coefficient adaptation in the j-th tap group is $\mu_j$. The step size $\mu_j$ is transmitted to the tap coefficient generator $30_i$ according to the calculated mapping. The step size calculation method as described above, permits an increased step size for the coefficients in tap groups consisting of large absolute value coefficients and reducing the convergence time of the adaptive filter.

FIG. 27 is a block diagram showing the internal construction of the tap group selection data updating circuit 140. The "coefficient sums" from the coefficient evaluation circuit 130 is supplied to a selection time calculating circuit 1401. The selection time calculating circuit 1401 calculates a selection time, during which the tap group selection is continued, according to the "coefficient sums". Specifically, the selection time is set to be long for a tap group with a large sums of absolute coefficient values, so that new active tap setting is done only in that tap group. For example, it is described in Literature 5 that the selection time $T_j$ (j being 1 to 5) of j-th tap group in the above example can be expressed as:

$$Tj = \frac{Aj}{A_{max}} \cdot (T_{max} - T_{min}) + T_{min} \quad (2)$$

where $A_j$ is the sum of absolute coefficient values in the j-th tap group, $A_{max}$ is the maximum value among the sums of absolute coefficient values in each tap groups, and $T_{max}$ and $T_{min}$ are the maximum and minimum selection times, respectively. Specifically, the selection time is set to $T_{min}$ for the tap group with the minimum sum of absolute coefficient values, $T_{max}$ with the maximum absolute tap coefficient value sum tap group, and to a time corresponding to the sum of absolute coefficient values for the other tap groups.

The selection time $T_j$ is generally expressed in units of number of coefficient adaptation times. This value is supplied to a counter 1402. The counter 1402 counts coefficient adaptations, and whenever the number of tap coefficient adaptation times reaches $T_j$, it supplies a read address updating signal to a counter 1403. The counter 1403 counts read address signals supplied from the counter 1402, until its count reaches the total number M of tap groups, and supplies a tap group selection order update signal to a switch 1402, while resetting its count to zero. Upon reception of the tap group selection order update signal, the switch 1404 is closed to pass the tap group indexes, which are supplied as "order" from the tap coefficient evaluation circuit 130, in the supplied order as a "tap group selection order". The output signal of the tap group selection order updating circuit 140 is written in the group order memory 150 from the forefront address thereof. As a result of this writing operation, the tap group selection order held in the selection order memory 150 is updated.

As is obvious from the above description, the tap control range is successively shifted over the entire taps, and it is thus possible, even when substantially a plurality of significant response parts are present as multi-echoes, to obtain fast convergence and arrange the tap coefficients only in the significant response parts. In addition, tap indexes taken out from one of the memories $110_1$ to $110_L$ always becomes active, thus leading to no waste of operation. Furthermore, when the tap index selecting circuit 112 determines the index to a tap to be newly arranged, the longest time is selected for a memory corresponding to the most significant tap group, is first selected. The coefficients thus can be arranged at the correct taps in a short period of time, permitting reduction of the convergence time. Moreover, it is possible to vary the step size in coefficient adaptation according to the importance of the tap group including each coefficient, thus further reducing the convergence time.

However, when a highly nonstationary signal such as a speech signal is supplied to the prior art adaptive filter as described above, errors in coefficient values and positions result from adaptation thereof executed while the input signal amplitude is small. This is attributable to the facts that the low input signal amplitude is readily disturbed by additive noise or the like and that adaptation of coefficients and positions executed with such an input signal is inaccurate.

SUMMARY OF THE INVENTION

An object of the present invention is to provide a method of and an apparatus for unknown system identification with an adaptive filter, which is free from errors in coefficient values or their positions even when a highly nonstationary signal is supplied.

According to an aspect of the present invention, there is provided a method of unknown system identification with adaptive filter comprising the steps of storing, as active tap indexes, active tap indexes provided with coefficients used for multiplying and adding operations, among the taps of and adaptive filter, arranging coefficients for only the active taps, storing, as inactive indexes in a queue, tap indexes without provision of any coefficient used for multiplying or adding operation, making, after updating the coefficients corresponding to the active tap, the tap indexes provided with coefficients of small absolute values to be inactive, storing the inactive tap indexes at the end of the queue, obtaining, when identifying an unknown system by using the adaptive filter for adaptively controlling tap positions by taking out the forefront inactive tap index in the queue and making the taken-out tap index active, evaluation function values corresponding to input signal samples of the adaptive filter, and stopping the coefficient adaptation and adaptive tap position control according to the result of comparison of the obtained evaluation function values with a predetermined threshold value.

According to another aspect of the present invention, there is provided a system of unknown system identification with an adaptive filter for making tap coefficient adaptation by using an error signal obtained by subtracting an identifying signal provided from the adaptive filter from the output of the unknown system, comprising a plurality of cascade-connected delay elements for delaying the input signal of the unknown system, a routing switch for selectively passing some of the delayed signals from the delay elements, a plurality of coefficient generators for generating tap coefficients by receiving the output signal of the routing switch, the error, a coefficient-clear signal and step size, a plurality of multipliers for multiplying the coefficient values provided from the coefficient generators and output signals of the routing switch by one another, an adder for adding together the outputs of the multipliers and thus providing the identifying signal, a subtracter for subtracting the identifying signal from the output of the unknown system and thus obtaining the error, and a tap control circuit for generating a tap position control signal for controlling the routing switch, the coefficient-clear signal and the step size by receiving the input signal samples, the outputs of the delay elements and the coefficient values provided from the coefficient generators, the tap control circuit including an input signal evaluation circuit for setting the step sizes to zero and also stopping the updating of the tap position control signal according to the input signal samples and evaluation function values corresponding to the outputs of the delay elements.

According to other aspect of the present invention, there is provided a system of unknown system identification with an adaptive filter for making coefficient adaptation by using an error obtained by subtracting an identifying signal provided from the adaptive filter from the output of the unknown system, comprising a plurality of cascade-connected delay elements for delaying the input signal of the unknown system, a routing switch for selectively passing some of the delayed signals from the delay elements, a power level evaluation circuit for evaluating the power level of the input signal by receiving the output signal of the routing switch, a plurality of coefficient generators for generating coefficients by receiving the output signal of the routing switch, an error, a coefficient-clear signal, step sizes and the input signal power level, a plurality of multipliers for multiplying the coefficients provided from the tap coefficient generators and output signals of the routing switch by one another, an adder for adding together the outputs of the multipliers and thus providing the identifying signal, a subtracter for subtracting the identifying signal from the output of the unknown system and thus obtaining the error, and a tap control circuit for generating a tap position control signal for controlling the routing switch, the coefficient-clear signal and the step sizes by receiving the input signal samples, the outputs of the delay elements and the coefficient values provided from the coefficient generators, the tap control circuit including an input signal evaluation circuit for setting the step sizes to zero and also stopping the updating of the tap position control signal according to the input signal samples and evaluation function values corresponding to the outputs of the delay elements.

Other objects and features will be clarified from the following description with reference to attached drawings.

PREFERRED EMBODIMENTS OF THE INVENTION

Preferred embodiments of the present invention will now be described with reference to the drawings.

Figure 1:
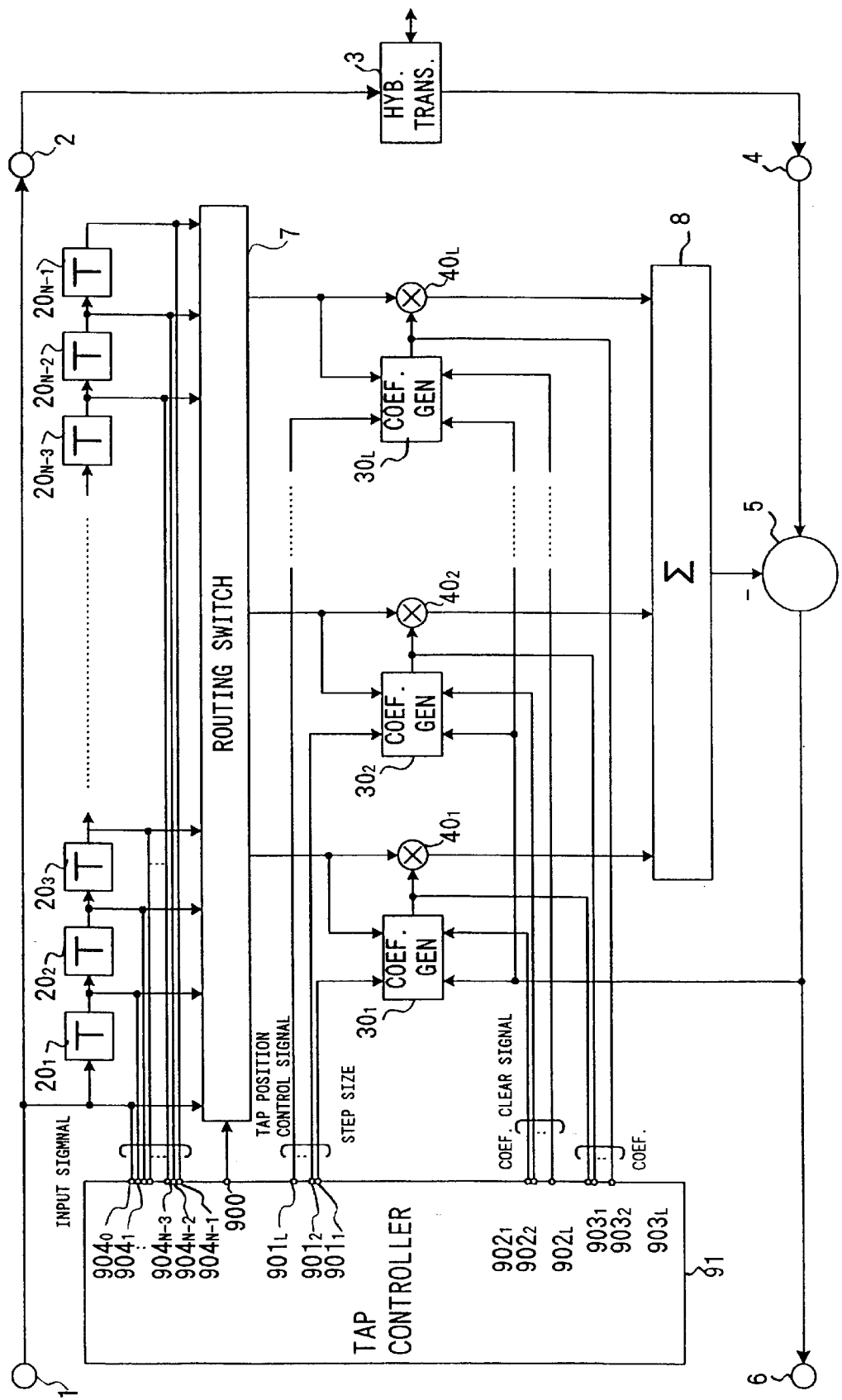
FIG. 1 is a block diagram showing a first embodiment of the invention.
Figure 24:
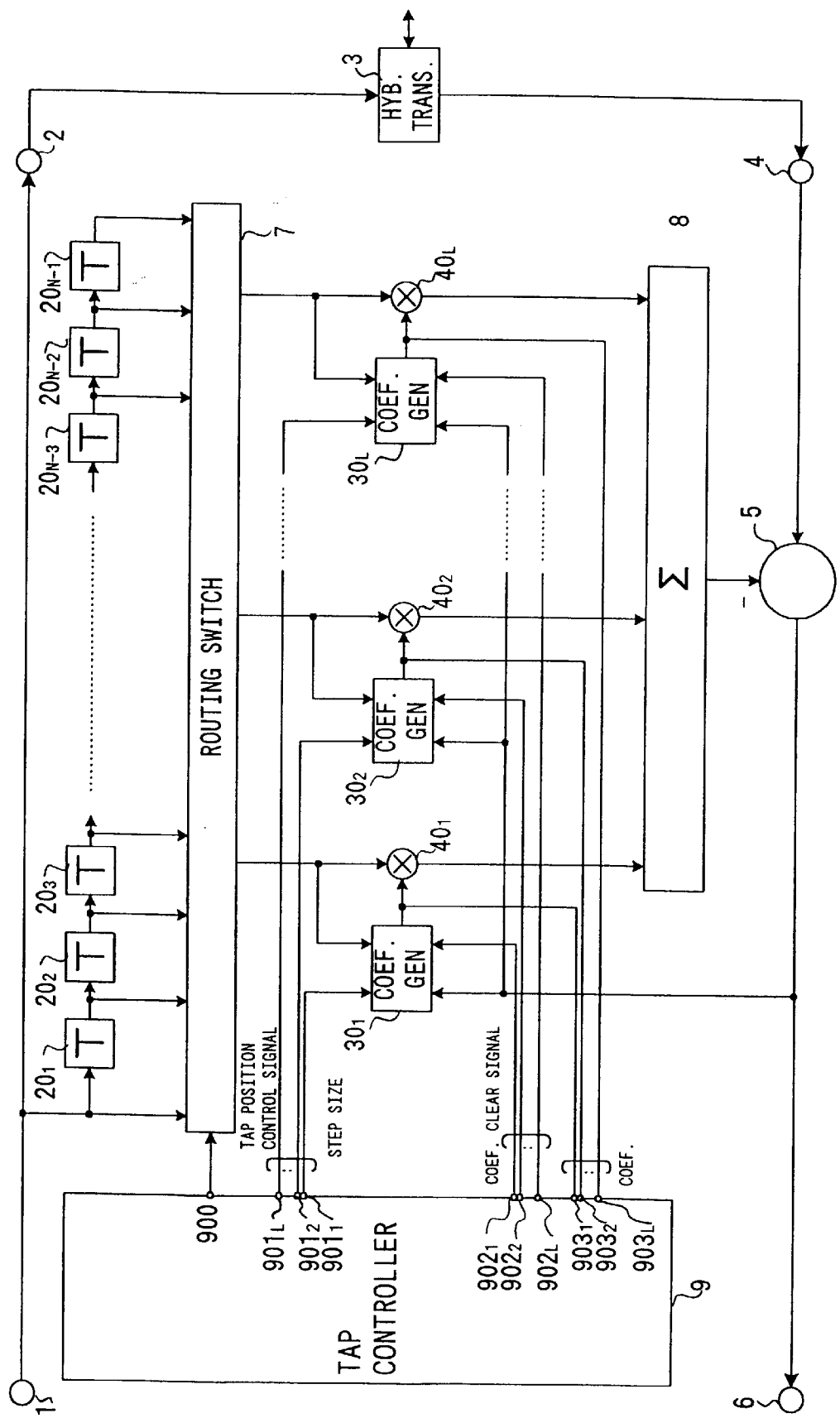
FIG. 24 is a block diagram showing the construction of the prior art echo canceller.

FIG. 1 is a block diagram showing a first embodiment of the invention. FIG. 1 is the same as the block diagram of FIG. 24 showing the prior art construction except for a tap control circuit 91. The embodiment will now be described in detail mainly in connection with the difference.

The tap control circuit 91 shown in FIG. 1 is different from the tap control circuit 9 shown in FIG. 24 in that it has input terminals $904_0$ to $904_{N-1}$. Input signal samples are supplied to the input terminals $904_1$ to $904_{N-1}$ from the input side of the delay element 20, and the output side of the delay elements $20_1$ to $20_{N-1}$. These input signals samples are supplied to the adaptive filter. The tap control circuit 91 evaluates these input signal samples, and when the result of evaluation obtained is less than a predetermined value, it stops adaptation of coefficients and tap positions.

Figure 2:
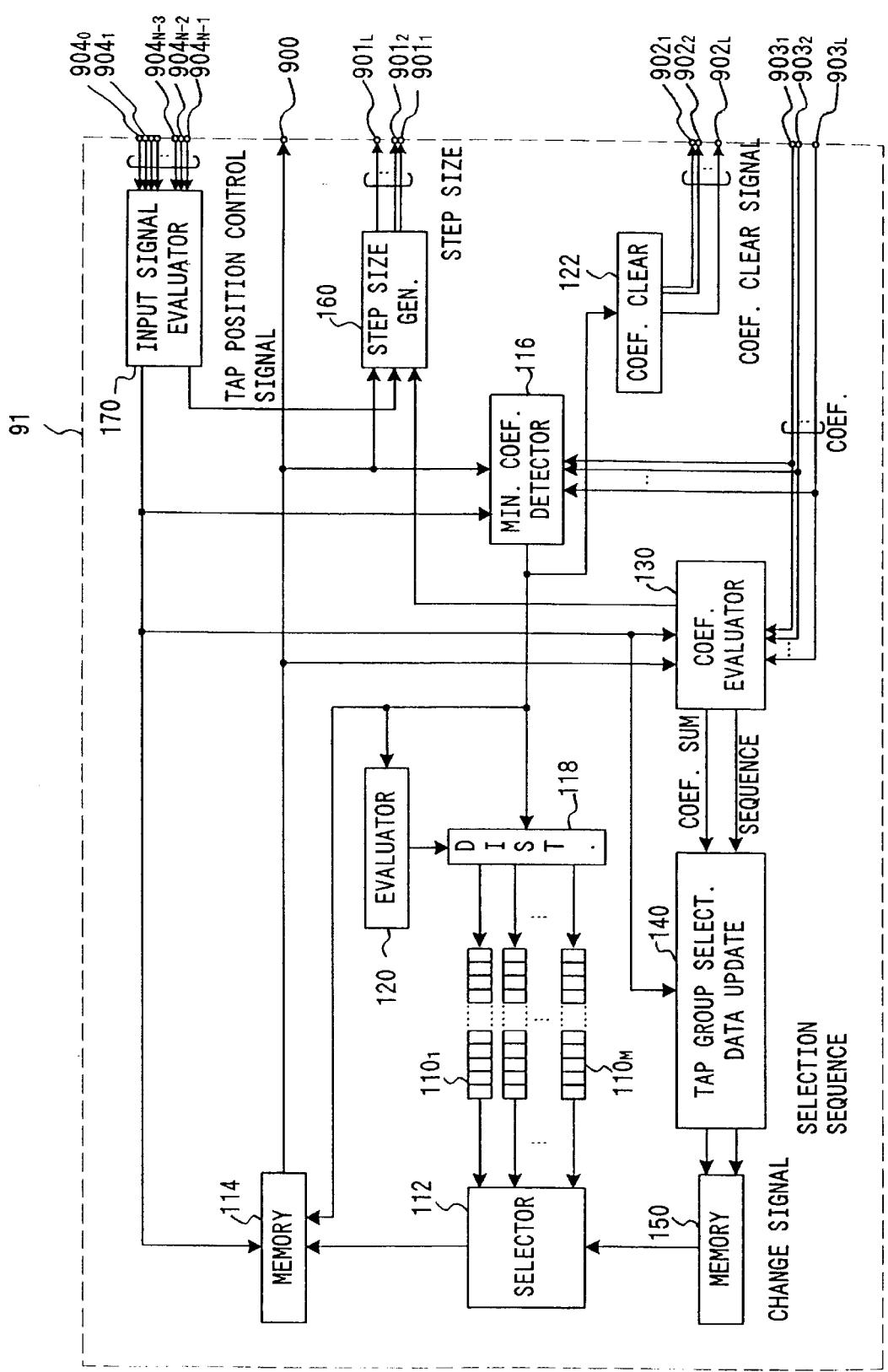
FIG. 2 is a block diagram showing the construction of the tap control circuit 91 in the first embodiment.
Figure 26:
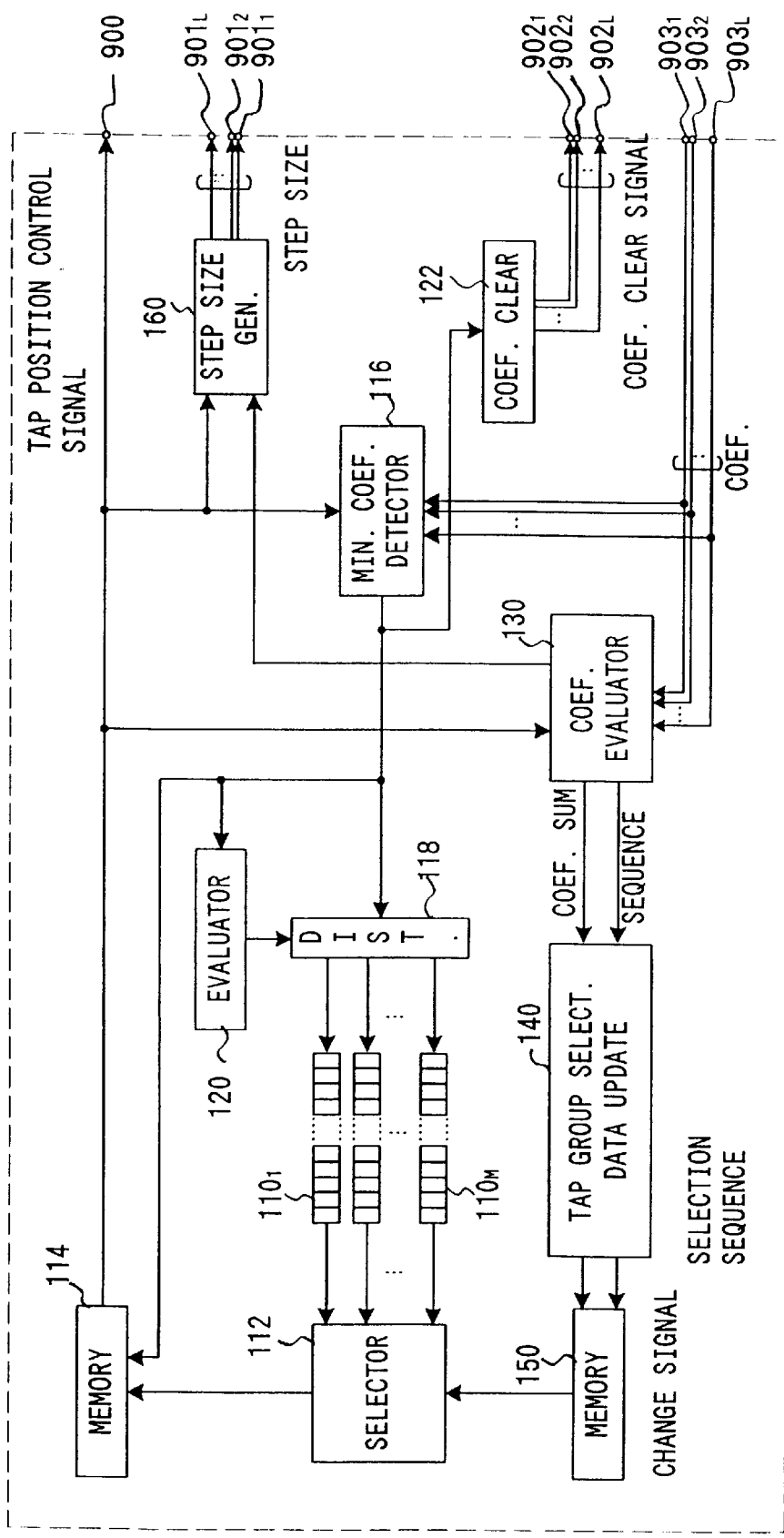
FIG. 26 is a block diagram showing the construction of the prior art tap control circuit.
Figure 27:
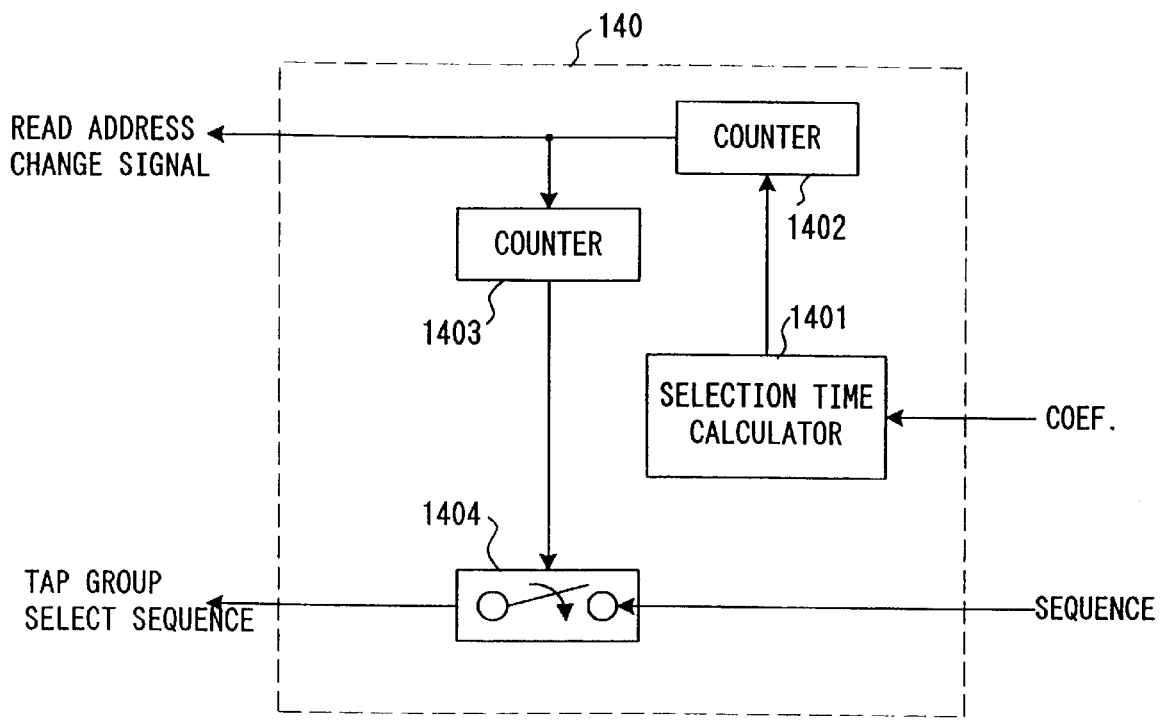
FIG. 27 is a block diagram showing the internal construction of the prior art tap group selection data updating circuit.

FIG. 2 is a block diagram showing the construction of the tap control circuit 91. FIG. 2 is the same as the block diagram of FIG. 26 showing the tap control circuit 9 except for an input signal evaluation circuit 170, and the tap control circuit 91 will now be described mainly in connection with the reference. The input signal samples from the input side of the delay element 201 and the output side of the delay elements $20_1$ to $20_{N-1}$, are supplied to the input terminals $904_0$ to $904_{N-1}$. The input signal evaluation circuit 170 evaluates input signal power level from these input signal samples. When the obtained input signal power level is below a first predetermined threshold level, the input signal evaluation circuit 170 provides a stop signal for coefficient adaptation. The coefficient adaptation stop signal is transmitted to the step size generator 160 and used to set all the step size, i.e., the step size transmitted via the output terminals $901_1$ to $901_L$ to the coefficient generators $30_1$ to $30_L$, to zero. With the step size set to zero, no tap coefficient is actually updated although coefficient adaptation operation is executed.

When the obtained input signal power level is less than a second predetermined threshold level, the input signal evaluation circuit 170 provides a tap position control stop signal. The tap position control stop signal is supplied to the index memory 114, the coefficient evaluation circuit 130, the tap group selection data updating circuit 140 and the minimum coefficient detecting circuit 116 and used to stop tap position. Specifically, the tap position control stop signal causes the index memory 114 to stop replacing the tap index supplied from the minimum coefficient detecting circuit 116 with the tap index supplied from the index selecting circuit 112. The stop signal also causes the tap coefficient evaluation circuit 130 to stop the calculation of the "coefficient sum" and the "order" and stop transmission of these data to the tap group selection data updating circuit 140. The stop signal further causes the tap group selection data updating circuit 140 to stop the updating of the tap group selection data. The stop signal yet further causes the minimum coefficient detecting circuit 116 to stop the detection of the tap index corresponding to the minimum absolute valued coefficient and also stop the supply of detected tap index to the index memory 114, the evaluation circuit 120, the distributing circuit 118 and the coefficient clearing circuit 122. The tap position control is stopped by the above set of stop operations.

Figure 3:
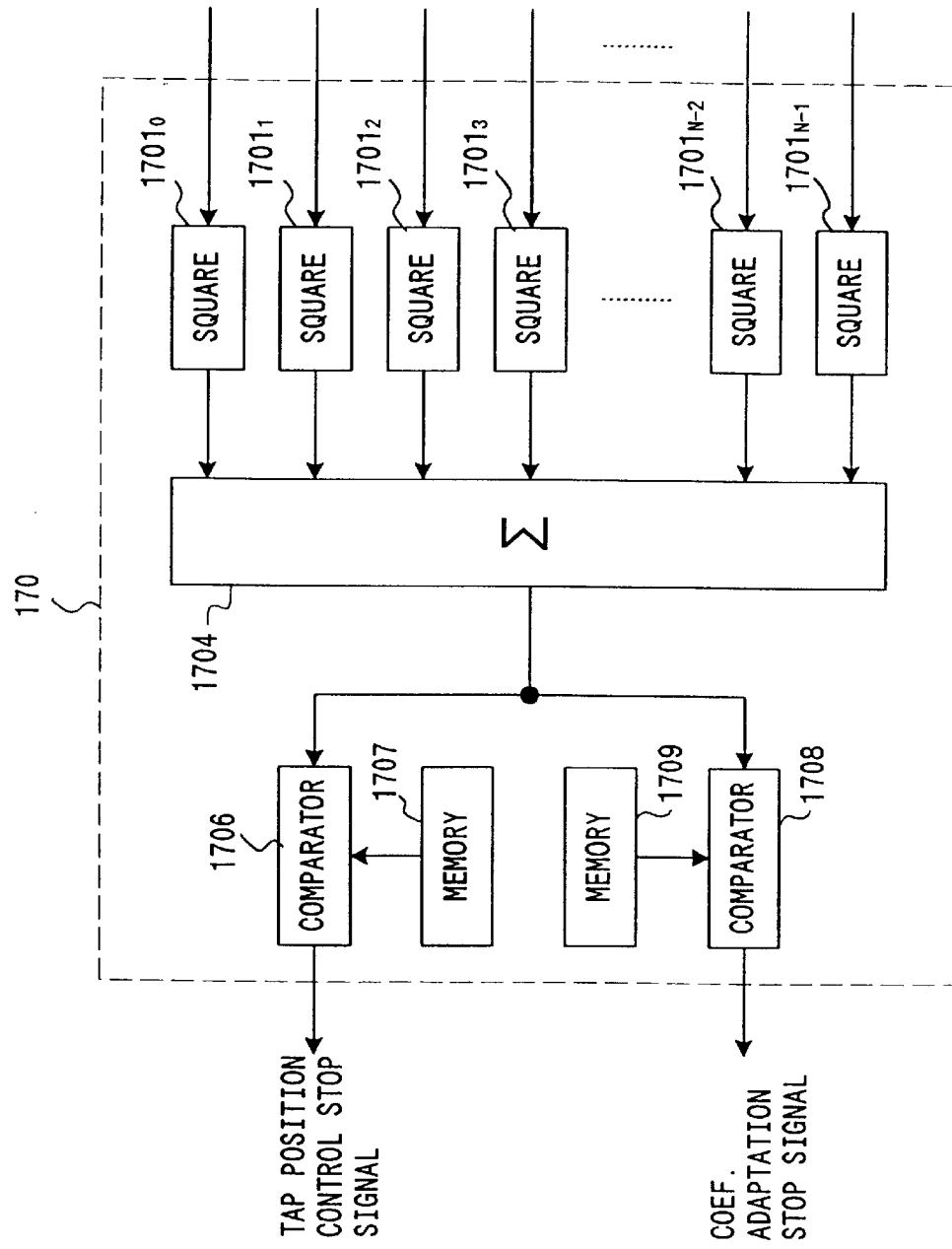
FIG. 3 is a block diagram showing the construction of the input signal evaluation circuit 170 in the first embodiment.

FIG. 3 is a block diagram showing the construction of the input signal evaluation circuit 170. Squaring circuits $1701_0$ to $1701_{N-1}$ square the input signal samples supplied from the input side of the delay element 20, and the output side of the delay elements $20_1$ to $20_L$ to the input signal circuit 170, and supply the squares to an adder 1704. The adder 1704 adds together the squared input signal samples to obtain an input signal power level, and supplies this level to comparators 1706 and 1708. The comparators 1706 and 1708 compare the input signal power level supplied from the adder 1704 with a first and a second threshold level supplied from memories 1707 and 1709, respectively. When the input signal power level is less than the first threshold level, the comparator 1706 provides a tap position control stop signal. When the input signal power level is less than the second threshold level, the comparator 1708 provides a coefficient adaptation stop signals.

Figure 4:
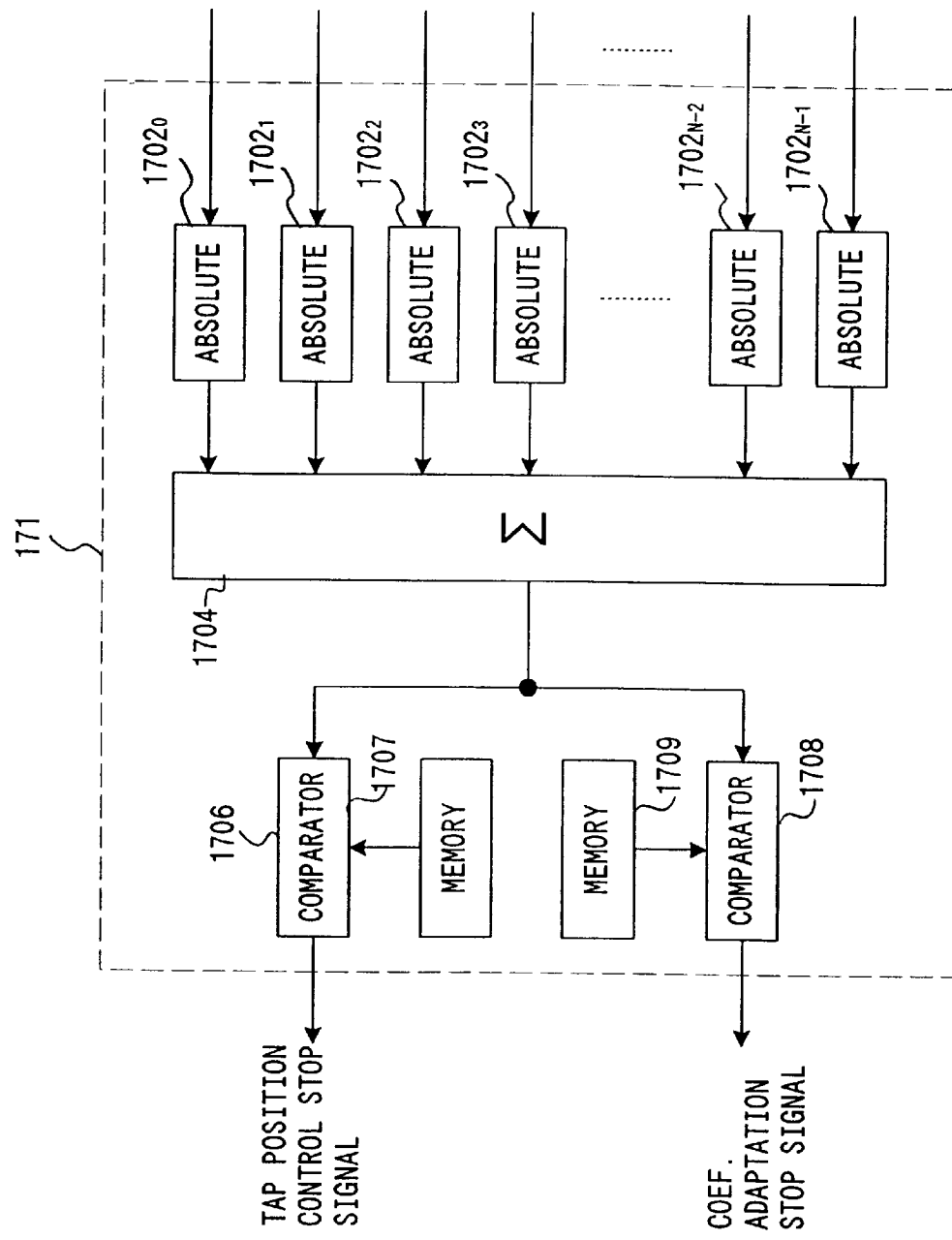
FIG. 4 is a block diagram showing the input signal evaluation circuit 171 in the first embodiment.

The tap control circuit 91 shown in FIG. 2 may employ an input signal evaluation circuit 171 as shown in FIG. 4 in lieu of the input signal evaluation circuit 170. The input signal evaluation circuit 171 evaluates the absolute value of the input signal by using the input signal samples. When the sum of the absolute values of the input signal samples is less than a first threshold value, the input signal evaluation circuit 171 provides a coefficient adaptation stop signal. When the sum is less than a second threshold value, the circuit 171 provides a tap position control stop signal.

FIG. 4 is a block diagram showing the input signal evaluation circuit 171 in detail. The input signal evaluation circuit 171 is different from the input signal evaluation circuit 170 in that it employs absolute value circuits $1702_0$ to $1702_{N-1}$ in lieu of the square circuits $1701_0$ to $1701_{N-1}$ in the input signal evaluation circuit 170. That is, not the squares but the absolute values of the input signal samples are supplied to the adder 1704. The adder 1704 thus adds together all the absolute input signal sample values to obtain the sum thereof, and supplies the sum to the comparators 1706 and 1708. The other constitution and operation of the input signal evaluation circuit 171 are the same as those of the input signal evaluation circuit 170, and are not described.

The tap control circuit 91 in FIG. 2 may further use an input signal evaluation circuit 172 in lieu of the input signal evaluation circuit 170. The input signal evaluation circuit 172 holds the coefficient-adaptation and tap-position-control stop signals, which have been obtained with the same constitution and operation as those in the input signal evaluation circuit 170, for a predetermined period of time, and then releases these signals.

Figure 5:
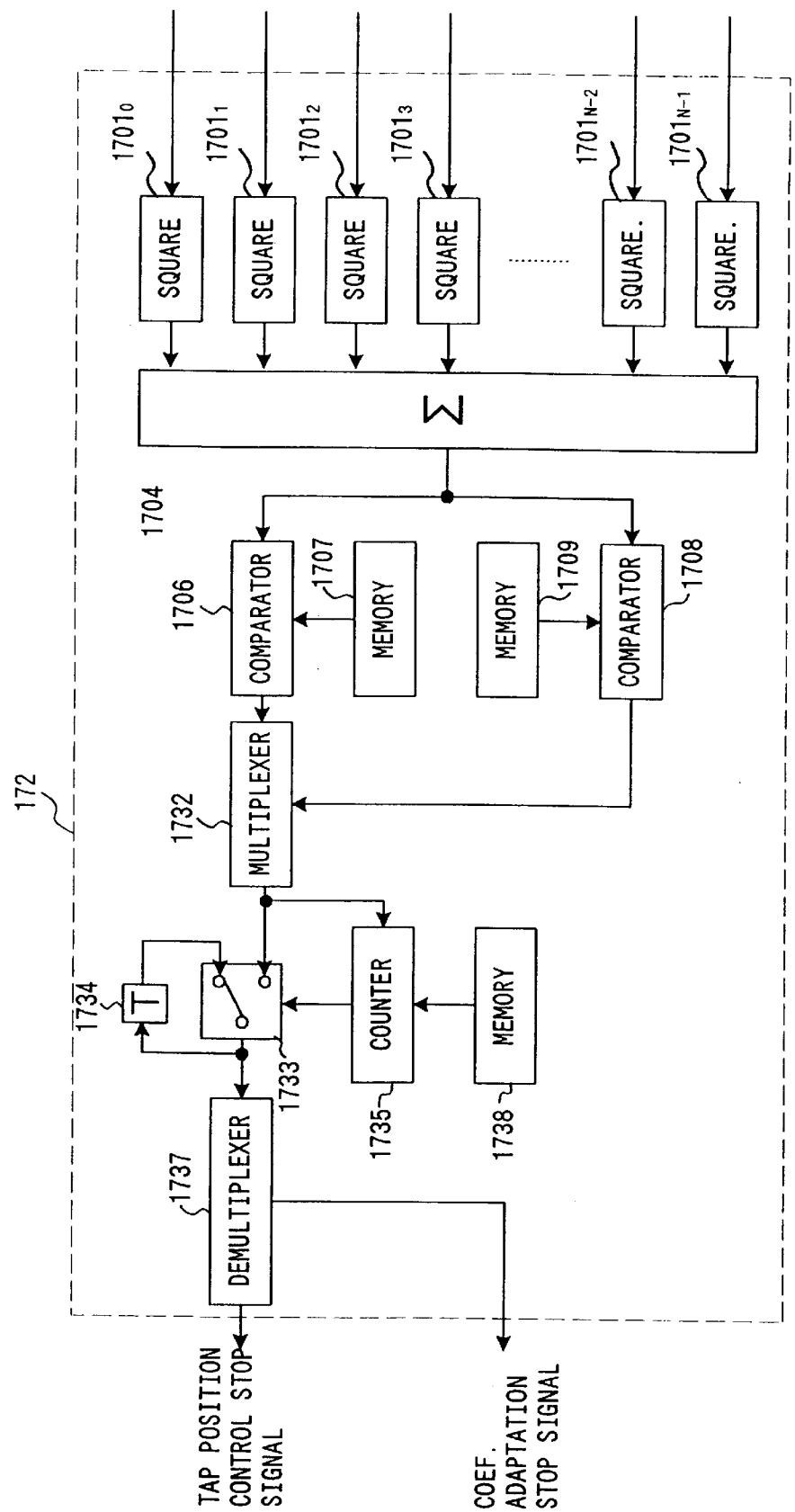
FIG. 5 is a block diagram showing the input signal evaluation circuit 172 in the first embodiment.

FIG. 5 is a block diagram showing the input signal evaluation circuit 172 in detail. The input signal evaluation circuit 172 is different from the input signal evaluation circuit 170 shown in FIG. 3 in that the output signals of the comparators 1706 and 1708 are further processed by a multiplexer 1732, a memory 1736, a counter 1735, a switch 1733, a delay element 1734 and a demultiplexer 1737. The coefficient-adaptation and tap-position-control stop signals from the comparators 1706 and 1708 are supplied to the multiplexer 1732. The multiplexer 1732 multiplexes these stop signals, and supplies a multiplexed signal thus with one input terminal of the switch 1733 and also with the counter 1735. The output signal of the switch 1733 is fed back through the delay element 1734 to the other input terminal of the switch 1733. When the switch 1734 is selecting this feedback route, its output is held. When the switch 1733 is selecting the other input terminal, a new multiplexed signal is provided. The demultiplexer 1737 receives the output of the switch 1733, and decomposes and independently provides the coefficient-adaptation and tap position control stop signals to the switch output. The switch 1733 is controlled by the counter 1735. The counter 1735 is reset and starts count-up when it receives a multiplexed signal from the multiplexer 1732. At the same time, the switch 1733 is switched to selectively pass the feedback signal from the delay element 1734. The counter 1735 counts up under control of a clock at a frequency equal to the input signal sampling frequency. The counter 1735 provides a switching signal when its count becomes equal to the value supplied from the memory 1736. When receiving the switching signal from the counter 1735, the switch 1733 is switched to selectively pass the multiplexed signal supplied from the multiplexer 1732. The other constitution and operation are the same as those of the input signal evaluation circuit 170, and are not described.

The tap control circuit 91 shown in FIG. 2 may employ an input signal evaluation circuit 173 in lieu of the input signal evaluation circuit 172. The input signal evaluation circuit 173 evaluates the absolute value of the input signal by using the input signal samples. When the sum of the absolute value of the input signal samples is less than a first predetermined threshold value, the input signal evaluation circuit 173 provides a coefficient-adaptation stop signal. When the sum is less than a second predetermined threshold value, the circuit 173 provides a tap position control stop signal.

Figure 6:
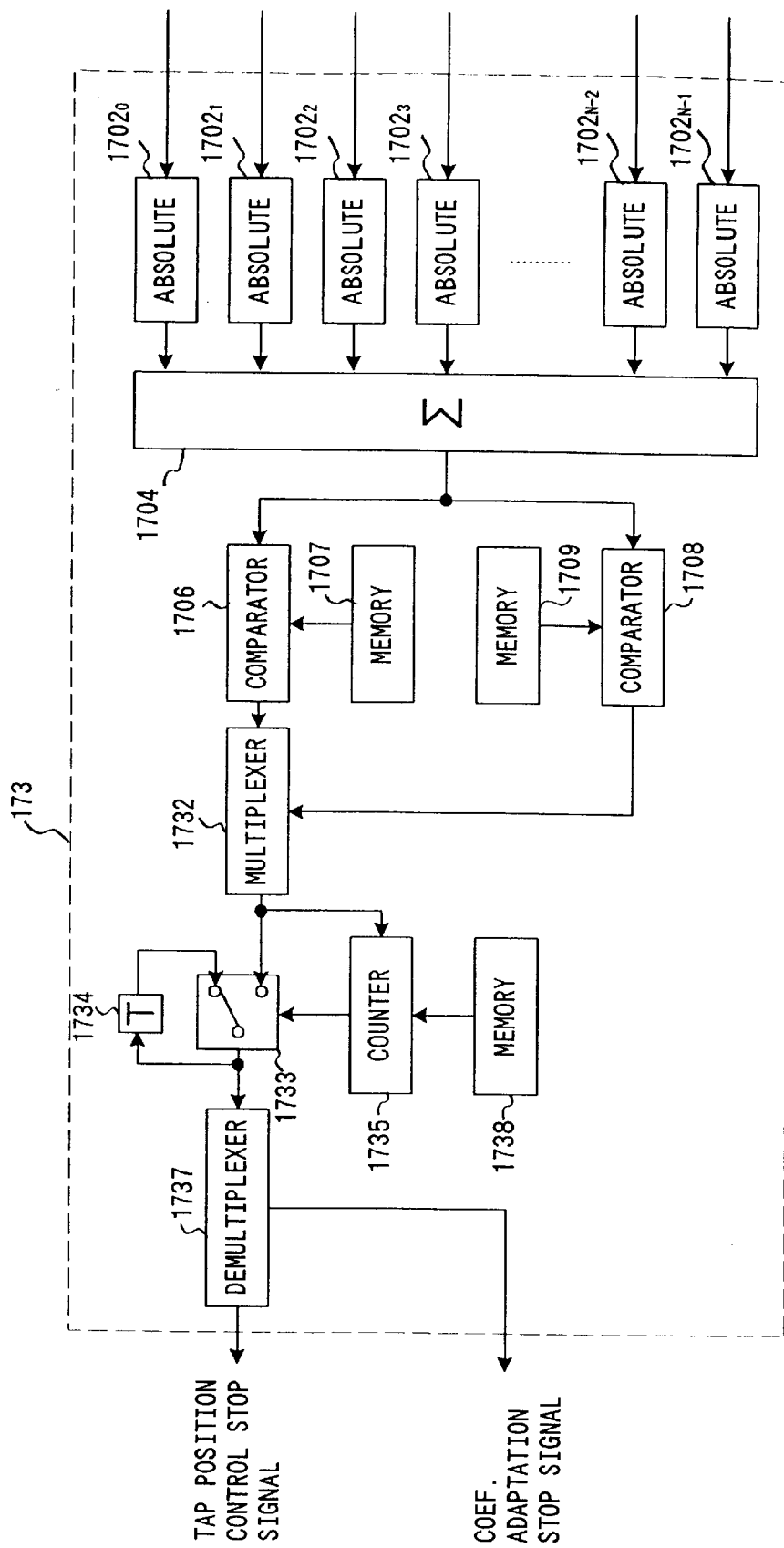
FIG. 6 is a block diagram showing the input signal evaluation circuit 173 in the first embodiment.

FIG. 6 is a block diagram showing the input signal evaluation circuit 173 in detail. The input signal evaluation circuit 173 is different from the input signal evaluation circuit 172 in that it employs absolute value circuits $1702_0$ to $1702_{N-1}$ in lieu of the squaring circuits $1701_0$ to $1701_{N-1}$ in the input signal evaluation circuit 172. That is, not the squares but the absolute values of the input signal samples are supplied to the adder 1704. The adder 1704 thus adds together the absolute input signal sample values to obtain the sum thereof, and supplies the sum to the comparators 1706 and 1708. The other constitution and operation are the same as those in the input signal separation circuit 172, and are not described.

While in the cases of FIGS. 5 and 6 the coefficient-adaptation and tap-position-control stop signals are multiplexed to obtain a multiplexed signal which is supplied to one input terminal of the switch 1733, it is possible to supply the two stop signals without multiplexing to one input terminal of the switch 1733. In this case, the multiplexer 1732 and the demultiplexer 1737 can be dispensed with, but additional circuits having the same constructions as the memory 1730, the counter 1735, the switch 1733 and the delay element 1734 should be provided to hold the stop signals.

While in the above input signal evaluation circuits 170 to 174 the signals obtained by processing the input signals are all added together in the adder 1074, it is possible to add only some of the processed signals. For example, the adder 1074 in the input signal evaluation circuit 170 may be adapted such that it adds together the outputs of the squaring circuits $1071_0$ to $1701_{K-1}$ (K being a positive integer smaller than N) in lieu of the outputs of all the squaring circuits $1701_0$ to $1701_{N-1}$. As another alternative, the adder 1074 may add together the outputs of the squaring circuits $1701_K$ to $1701_{N-1}$ in lieu of the outputs of all the squaring circuits $1701_0$ to $1701_{N-1}$. As a further alternative, the adder 1074 may add together the outputs of K selected squaring circuits among the squaring circuits $1701_0$ to $1701_{N-1}$ in lieu of the outputs of all the squaring circuits $1701_0$ to $1701_{N-1}$.

As an example, a case is considered, in which the adder 1704 in the input signal evaluation circuit 172 is adapted to add together the outputs of the squaring circuits $1701_0$ to $1701_{N/M-1}$ in lieu of the outputs of all the squaring circuits $1701_0$ to $1701_{N-1}$. In this case, the signal added together are obtained from the input signal samples supplied to the delay elements corresponding to the first tap group. When these samples are evaluated in the input signal evaluation circuit 172, the arrival of a silent section can be quickly detected at the tapped delay line constituted by the delay elements $20_1$ to $20_{N-1}$. By holding the coefficient-adaptation and tap-position-control stop signals from the detection of the silence for a period soecified by the value stored in the memory 1736, the coefficient adaptation and the tap position control can be suspended until the silence section has gone through the tapped delay line. At this time, the value stored in the memory 1736 is slightly greater than the total number N of delay elements.

Figure 7:
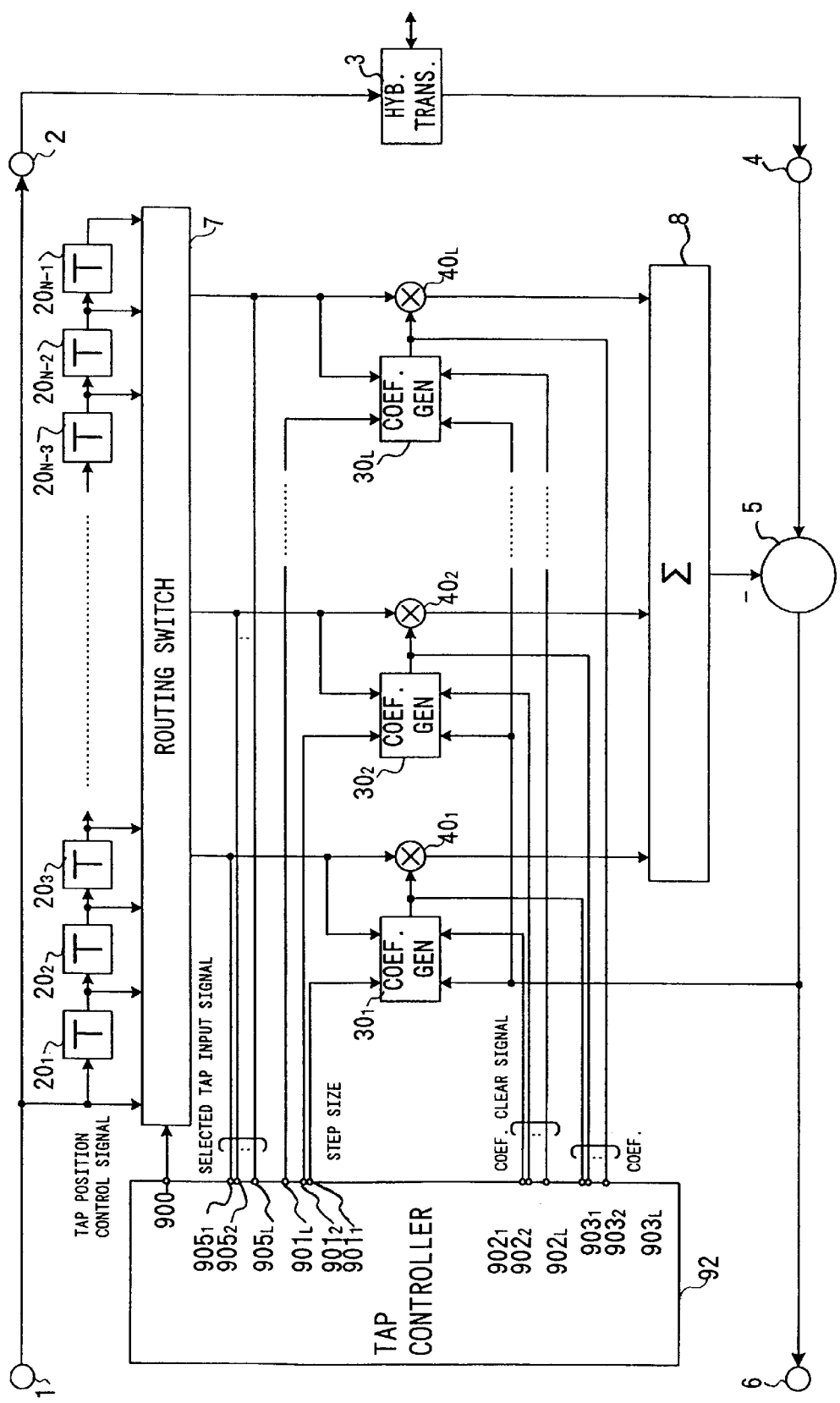
FIG. 7 is a block diagram showing a second embodiment of the invention.

FIG. 7 is a block diagram showing a second embodiment of the invention. This embodiment is different from the first embodiment in that it employs a tap control circuit 92 in lieu of the tap control circuit 91 shown in FIG. 1. Unlike the tap control circuit 91 shown in FIG. 1, which stops the coefficient adaptation and tap position control by evaluating the input to the delay element 20, and the outputs from the delay elements $20_1$ to $20_{N-1}$ supplied to its input terminals $904_0$ and $904_{N-1}$, the tap control circuit 92 stops the coefficient adaptation and tap position control by evaluating input signal samples corresponding to active tap indexes supplied to its input terminal $905_1$ to $905_L$.

Figure 8:
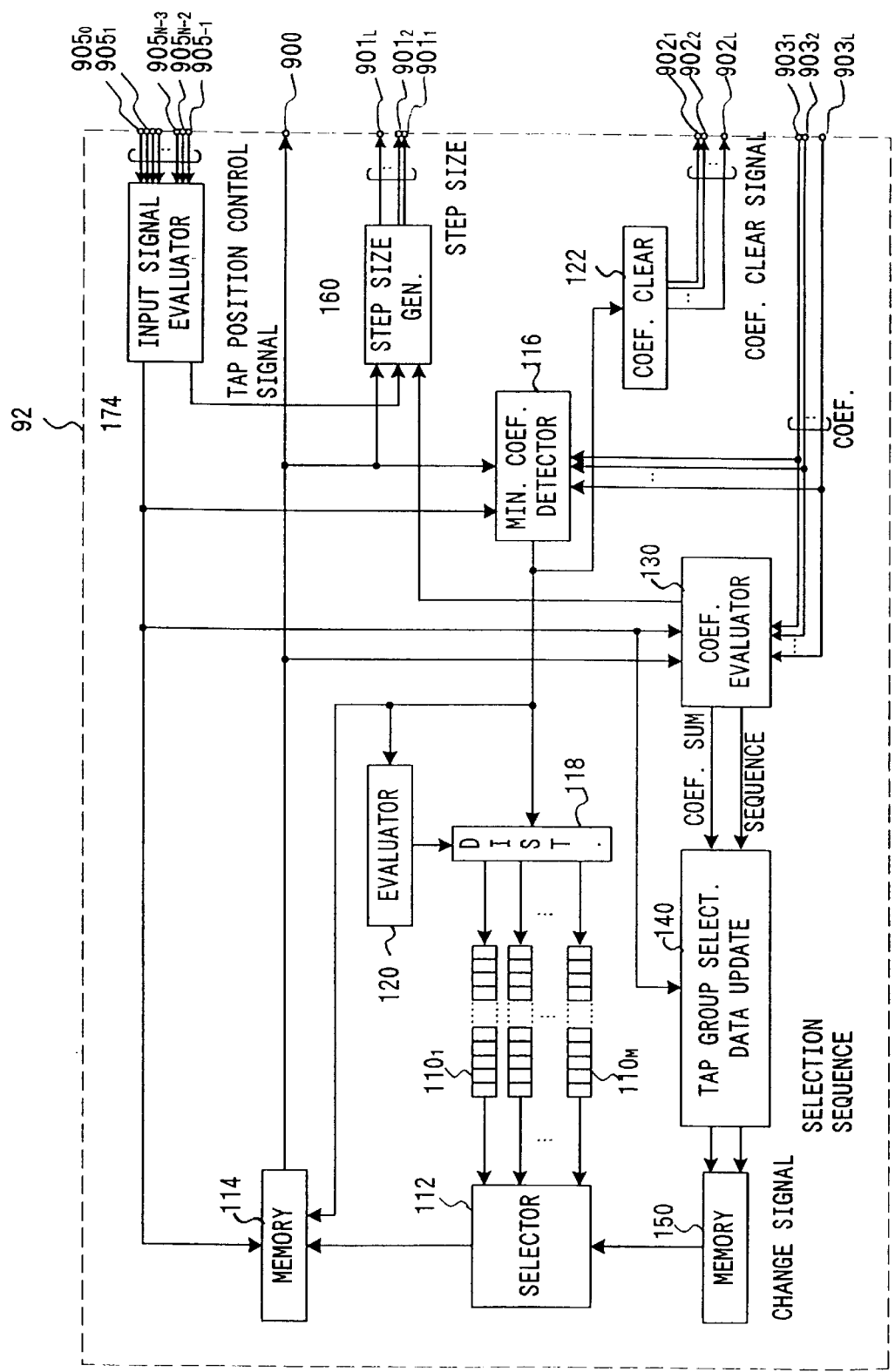
FIG. 8 is a block diagram showing the construction of the tap control circuit 92 in the second embodiment.

FIG. 8 is a block diagram showing the construction of the tap control circuit 92. FIG. 8 is the same as the block diagram of FIG. 2 showing the tap control circuit 91 except for the difference of an input signal evaluation circuit 174 and the input signal evaluation circuit 170 from each other. The operation of the embodiment will now be described in detail mainly in connection with this difference. Input signal samples from delay elements $20_i$ are supplied to the input terminals $905_1$ to $905_L$ of the input signal evaluation circuit 174. The value of i is prescribed by the routing switch 7. The input signal evaluation circuit 174 evaluates the input signal power level from these input signal samples. When the obtained input signal power level is below a first predetermined threshold level, the input signal evaluation circuit 174 outputs a coefficient adaptation signal. When the input signal power level is below a second predetermined thresholds level, the circuit 174 provides a tap position control signal. The coefficient adaptation and tap position control are stopped by using the coefficient-adaptation and tap-position-control stop signals entirely in the same way as in the input signal evaluation circuit 170, and the relevant operation is not described.

As the input signal evaluation circuit 174, the input signal evaluation circuit 170 can be directly used. While construction shown in FIG. 3 has N square circuits $1701_0$ to $1701_{N-1}$, the input signal evaluation circuit 174 may have only L square circuits $1701_0$ to $1701_{L-1}$. It is also obvious that the constructions shown in FIGS. 4 to 6 may be used as the input signal evaluation circuit 174 by changing the numbers of the square circuits and the absolute value circuits. Furthermore, like the case of the input signal evaluation circuit 170, the adder 1704 may be adapted to add together only some of the signals obtained by processing the input signals to the input signal evaluation circuit 174.

A third embodiment of the invention can be obtained by employing a tap control circuit 93 in lieu of the tap control circuit 91 in the first embodiment of the invention shown in the block diagram of FIG. 1. The third embodiment is different from the second embodiment of the invention only in the tap control circuit 93, which will now be described with reference to FIG. 9.

Figure 9:
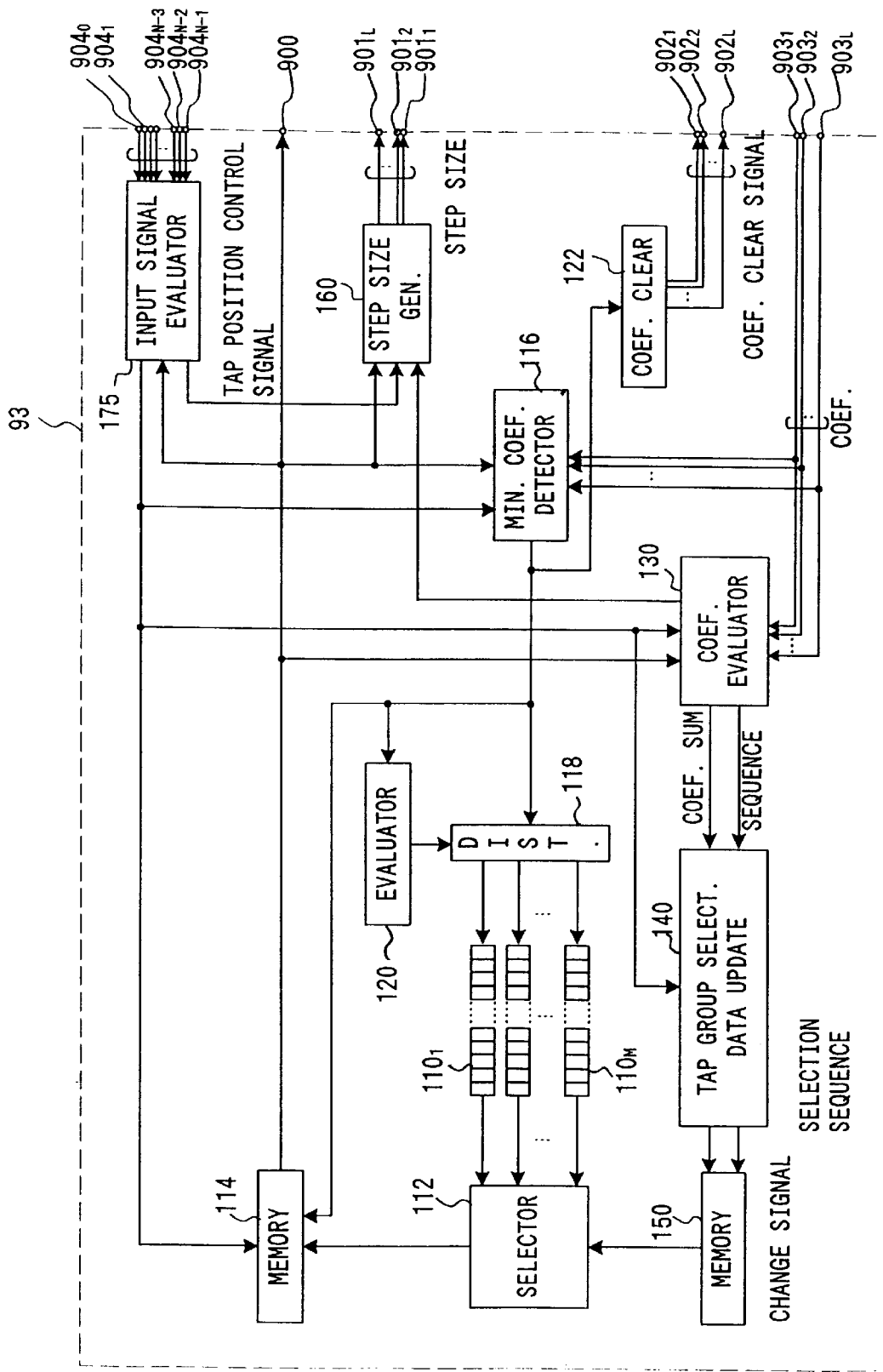
FIG. 9 is a block diagram showing the construction of the tap control circuit 93 in the third embodiment.

FIG. 9 is a block diagram showing the construction of the tap control circuit 93. FIG. 9 is the same as the block diagram of FIG. 8 showing the tap control circuit 91 except for the difference of an input signal evaluation circuit 175 and the input signal evaluation circuit 174 from each other. The operation will be described in detail mainly in connection with the difference. While the input signal evaluation circuit 174 evaluates the input signal power level from the input signal samples supplied to the active taps and thence supplied via the routing switch 7 to it and provides the coefficient-adaptation and tap-position-control stop signals according to the result of the evaluation, the input signal evaluation circuit 175 evaluates the input signal power level by receiving the input signal samples from the input side of the delay element $20_1$ and the output side of the delay elements $20_1$ to $20_{N-1}$. Like the input signal evaluation circuit 174, the input signal evaluation circuit 175 provides the coefficient-adaptation and tap-position-control stop signals according to the result of the evaluation. In this operation, however, the input signal evaluation circuit 175 selectively uses only the input signal samples supplied from the delay elements corresponding to the active taps. To this end, the index memory 114 supplies a tap position control signal to the input signal evaluation circuit 175. Thus, the input signal evaluation circuits 174 and 175, although different in construction, operate in the same way. Also, their output signals are interchangeable. The other components of the tap control circuit 93 than the input signal evaluation circuit 175 are entirely the same and operate in the same way as like components of the tap control circuit 91 than the input signal evaluation circuit 174, and are not described.

A fourth embodiment of the invention can be obtained by employing a tap control circuit 94 in lieu of the tap control circuit 92 in the second embodiment of the invention shown in the block diagram of FIG. 1. The fourth embodiment is different from the second embodiment of the invention only in the tap control circuit 94, which will now be described with reference to FIG. 10.

Figure 10:
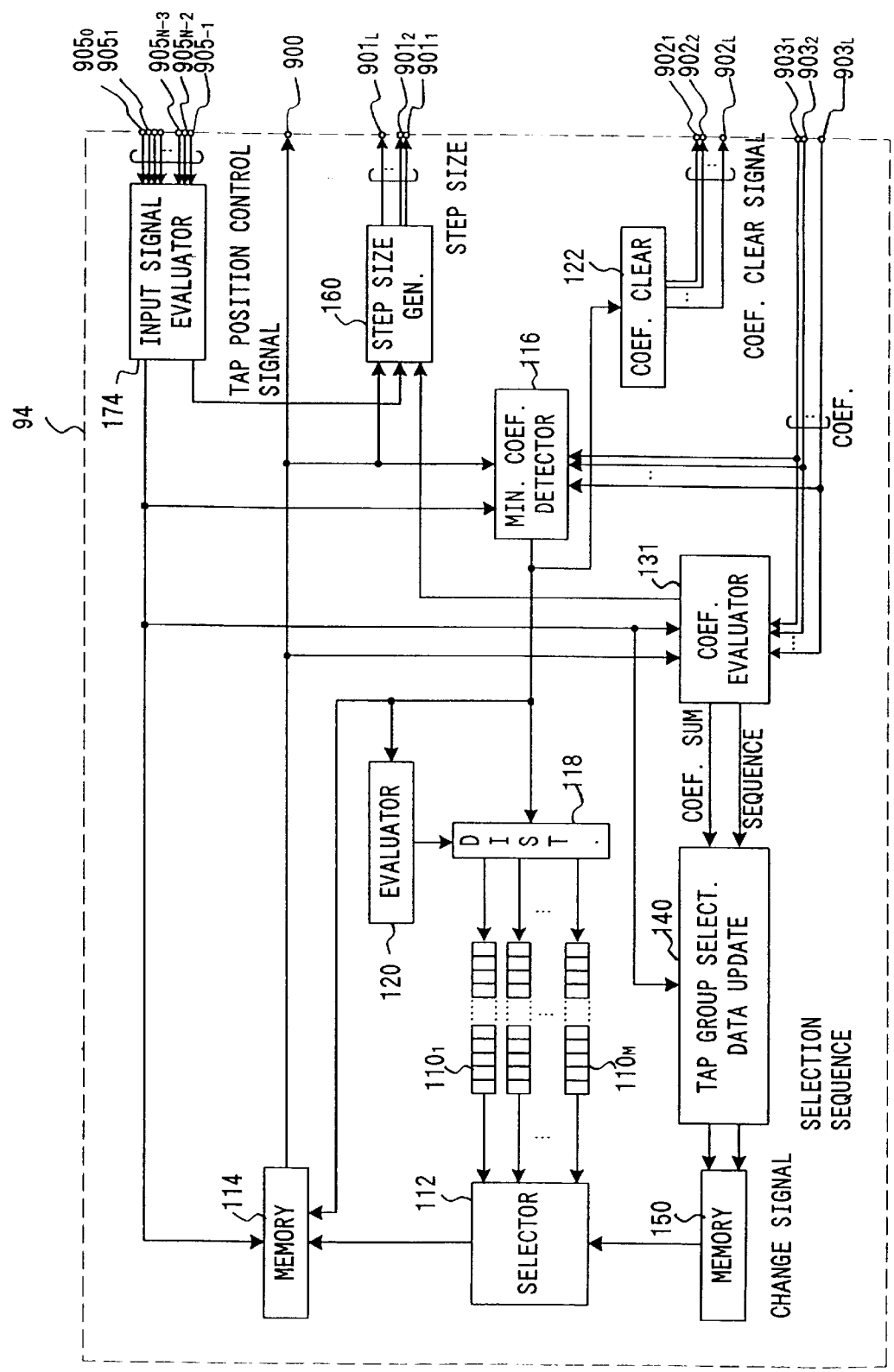
FIG. 10 is a block diagram showing the construction of the tap control circuit 94 in the fourth embodiment.

FIG. 10 is a block diagram showing the construction of the tap control circuit 94. FIG. 10 is the same the block diagram of FIG. 8 showing the tap control circuit 92 except for the difference of a tap coefficient enevaluation circuit 131 and the tap coefficient evaluation circuit 130. The operation of the embodiment will now be described in detail mainly in connection with the difference. While tap coefficient evaluation circuit 130 calculates the sum of absolute coefficient values as "coefficient sum" for each tap group, the tap coefficient evaluation circuit 131 calculates the sum of squared tap coefficients for each tap group, and supplies the calculated coefficients to the tap group selection data updating circuit 140. In addition, the ratio $R_j$ supplied to the step size generator 160 is calculated as $R_j = C_{j,max}/C_{max}$ from $C_j$, which is not the sum of absolute coefficient values but that of squared e tap coefficients in each tap group. $C_{max}$ is the maximum value of the sum of squared coefficients for all groups. The other components of the tap control circuit 94 than the tap coefficient evaluation circuit 131 are entirely the same in construction and operate in the same way as the other components of the tap control circuit 92 than the tap coefficient evaluation circuit 130, and are not described. Basically, the above description of the tap control circuit 92 can be used as the description of the tap control circuit 94 by replacing the absolute coefficient values with the squared coefficients.

Figure 11:
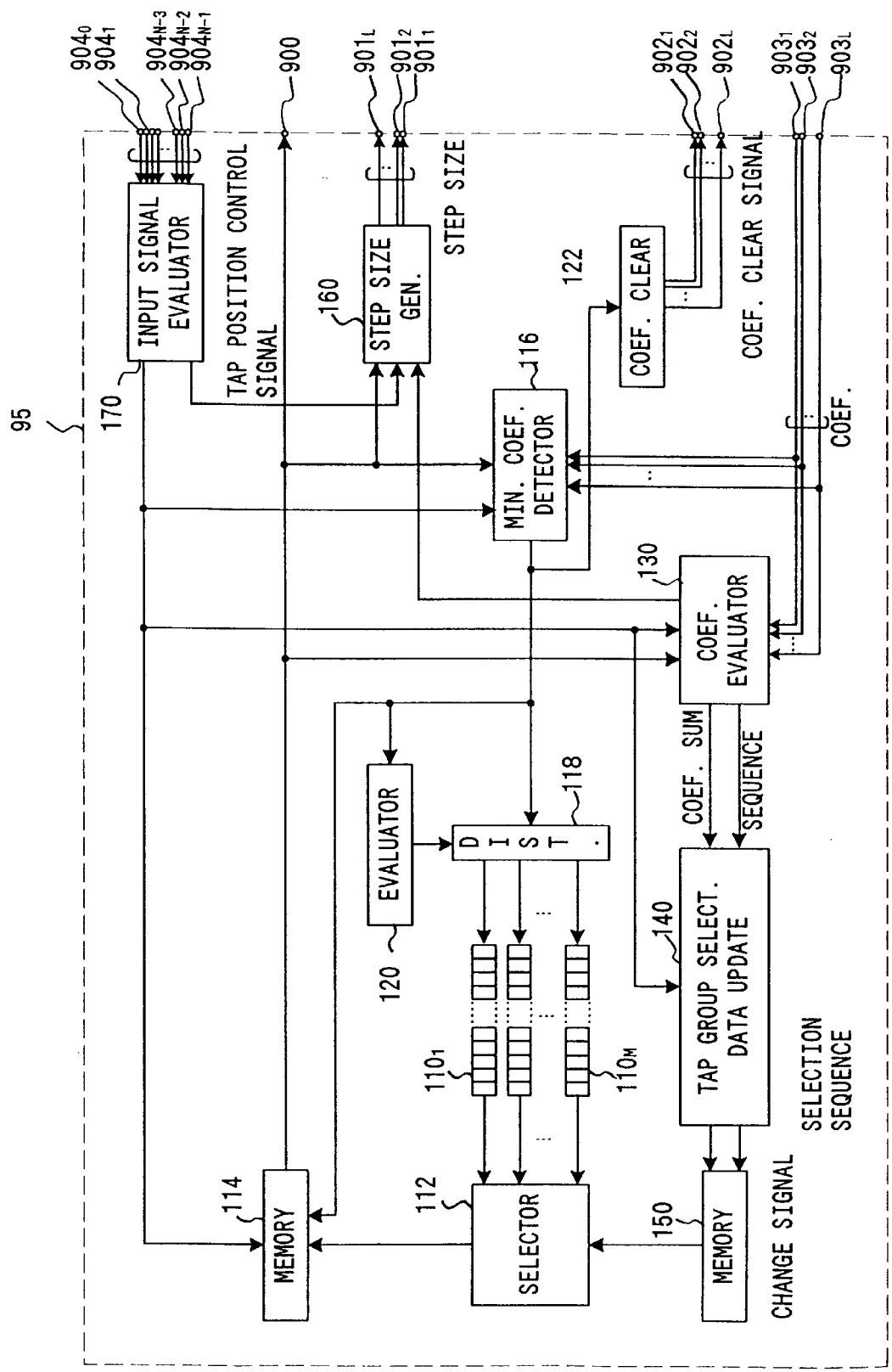
FIG. 11 is a block diagram showing a tap control circuit 95 in the fifth embodiment.

A fifth embodiment of the invention can be obtained by a tap control circuit 95 shown in FIG. 11 in lieu of the tap control circuit 91 in the first embodiment shown in the block diagram of FIG. 1. The mutual relation of the tap control circuits 91 and 95 are like that of the tap control circuits 92 and 94, which has already been described with reference to FIG. 10, and will not be described.

A sixth embodiment of the invention can be obtained by employing a tap control circuit 96 in lieu of the tap control circuit 92 in the second embodiment of the invention shown in the block diagram of FIG. 7. The sixth embodiment is different from the second embodiment of the invention only in the tap control circuit 96, which will now be described with reference to FIG. 12.

Figure 12:
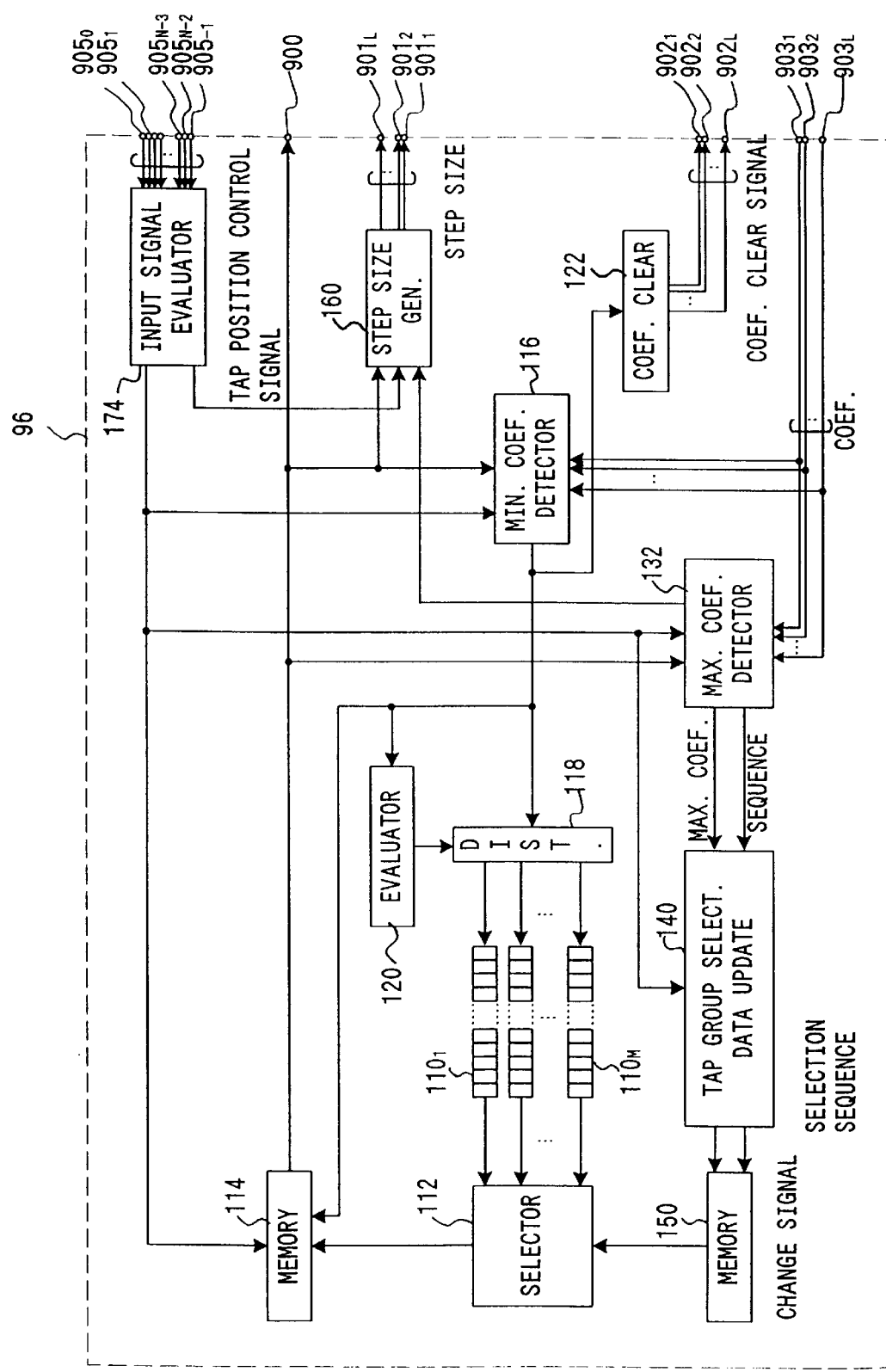
FIG. 12 is a block diagram showing the construction of the tap control circuit 96 in the sixth embodiment.

FIG. 12 is a block diagram showing the construction of the tap control circuit 96. FIG. 12 is the same as the block diagram of FIG. 8 showing the tap control circuit 92 except for the difference of a maximum coefficient detecting circuit 132 and the tap coefficient evaluation circuit 130 from each other. The operation will now be described in detail mainly in connection with this difference. While the tap coefficient evaluation circuit 130 calculates the sum of absolute coefficient values as "coefficient sum" for each tap group, the maximum coefficient detecting circuit 132 detects the maximum absolute value of coefficients for each tap group, and supplies the detected maximum value as "maximum coefficient" to the tap group selection data updating circuit 140. The maximum coefficient detecting circuit 132 calculates tap group selection time according to the "maximum coefficient" in lieu of the "coefficient sum". The circuit 132 further rearranges M such maximum coefficients in the order of larger values, and supplies the corresponding tap group index order as "order" to the tap group selection data updating circuit 140. The maximum coefficient detecting circuit 132 further calculates the ratio between the maximum value among the maximum coefficients of the tap groups; for example, it calculates the ratio $R_j = C_{j,max}/C_{max}$ ($1 \leq j \leq M$) where $C_{j,max}$ is the maximum tap coefficient of each tap group in the case where the number of taps is M. The circuit 132 supplies the calculated ratio $R_j$ to the step size generator 160. It is possible to obtain the same results by defining $C_{max}$ as the sum of the maximum coefficients of the tap groups. The other components of the tap control circuit 96 than the maximum tap coefficient detecting circuit 132 are entirely the same as and operate in the same way as the other components of the tap control circuit 92 than the tap coefficient evaluation circuit 130, and are not described. Basically, the description of the tap control circuit 92 can be used as the description of the tap control circuit 96 by replacing the sum of absolute coefficient values with the maximum absolute coefficient value.

Figure 13:
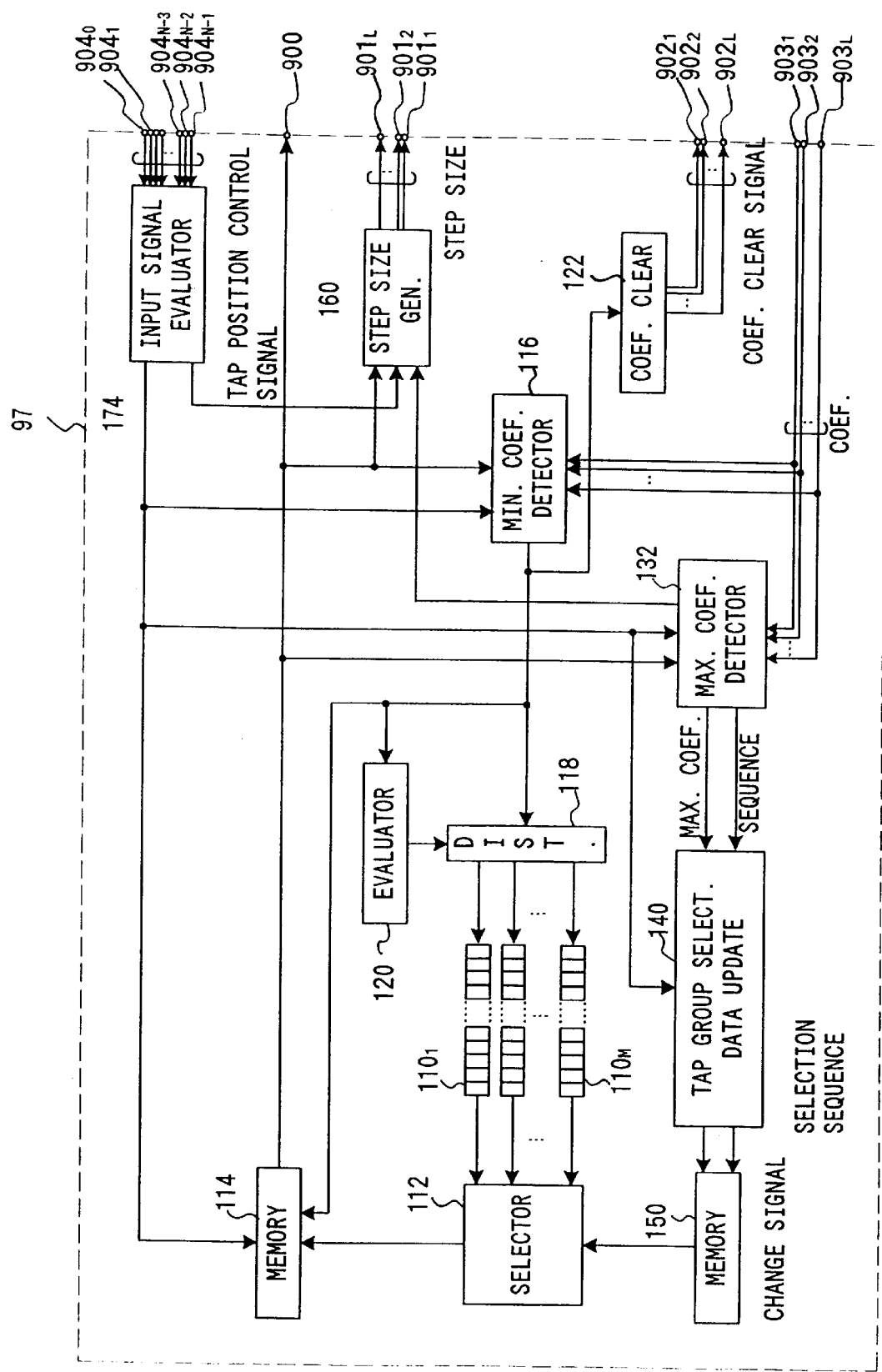
FIG. 13 is a block diagram showing a tap control circuit 97 in the seventh embodiment.

A seventh embodiment of the invention can be obtained by employing a tap control circuit 97 shown in FIG. 13 in lieu of the tap control circuit 91 in the first embodiment shown in the block diagram of FIG. 1. The seventh embodiment is different from the first embodiment of the invention only in the tap control circuit 97. The relation between the tap control circuits 91 and 97 is like the relation between the tap control circuits 92 and 96. This has been described with reference to FIG. 12, and is not described.

An eighth embodiment of the invention can be obtained by employing a tap control circuit 98 in lieu of the tap control circuit 92 of the second embodiment of the invention shown in the block diagram of FIG. 7. The eighth embodiment is different from the second embodiment of the invention only in the tap control circuit 98, which will be described with reference to FIG. 14.

Figure 14:
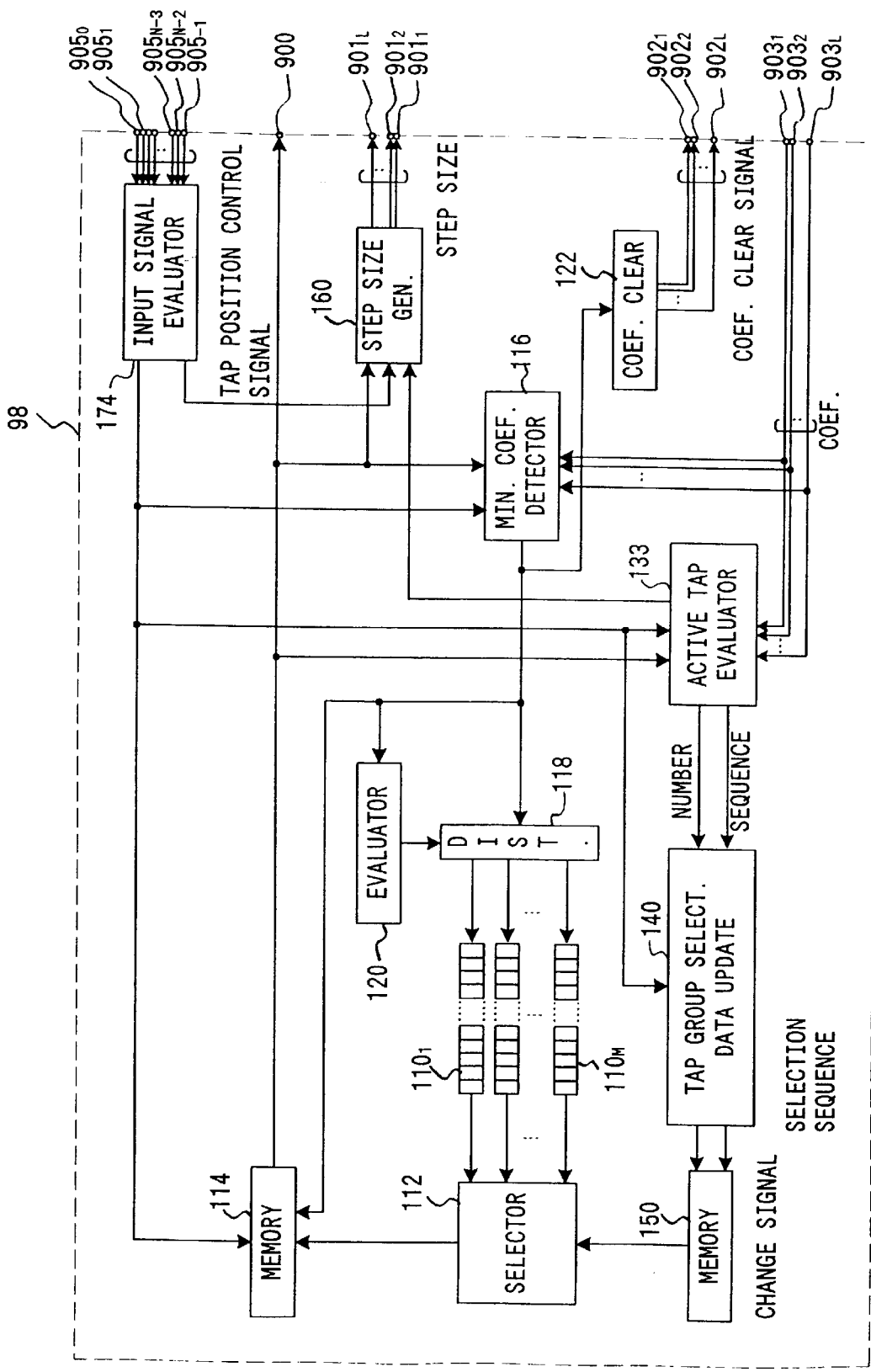
FIG. 14 is a block diagram showing the construction of the tap control circuit 98 in the eighth embodiment.

FIG. 14 is a block diagram showing the construction of the tap control circuit 98. FIG. 14 is the same as the block diagram of FIG. 8 showing the tap control circuit 92 except for the difference of an active tap evaluation circuit 133 and the tap coefficient evaluation circuit 130. The operation of the embodiment will be described mainly in connection with the difference. While the tap coefficient evaluation circuit 130 calculates the sum of absolute coefficient values as "coefficient sum", the active tap evaluation circuit 133 detects the number of active taps of each tap group. The detected number of active taps is supplied as "number" to the tap group selection data updating circuit 140. The tap group selection data updating circuit 140 calculates the tap group selection time according to the "number" in lieu of the "coefficient sum". The active tap evaluation circuit 133 calculates the ratio between the maximum number $C_{max}$ if active taps among the numbers of active taps in each tap group and the number of active taps in each tap group; for example, it calculates the ratio $R_j = C_{j,max}/C_{max}$ (where $1 \leq j \leq M$) where $C_{max}$ is the number of active taps in each tap group for M tap groups. The circuit 133 supplies the calculated ratio $R_j$ to the step size generator 160. The same results are obtainable by defining $C_{max}$ as the sum of the number of active taps in the tap groups. The other components in the tap control circuit 98 than the active tap evaluation circuit 133 are entirely the same in construction as and operate in the same way as the other components in the tap control circuit 92 than the tap coefficient evaluation circuit 130, and not described. Basically, the description of the tap control circuit 92 can be used as the description of the tap control circuit 98 by replacing the absolute coefficient value with the number of active taps.

Figure 15:
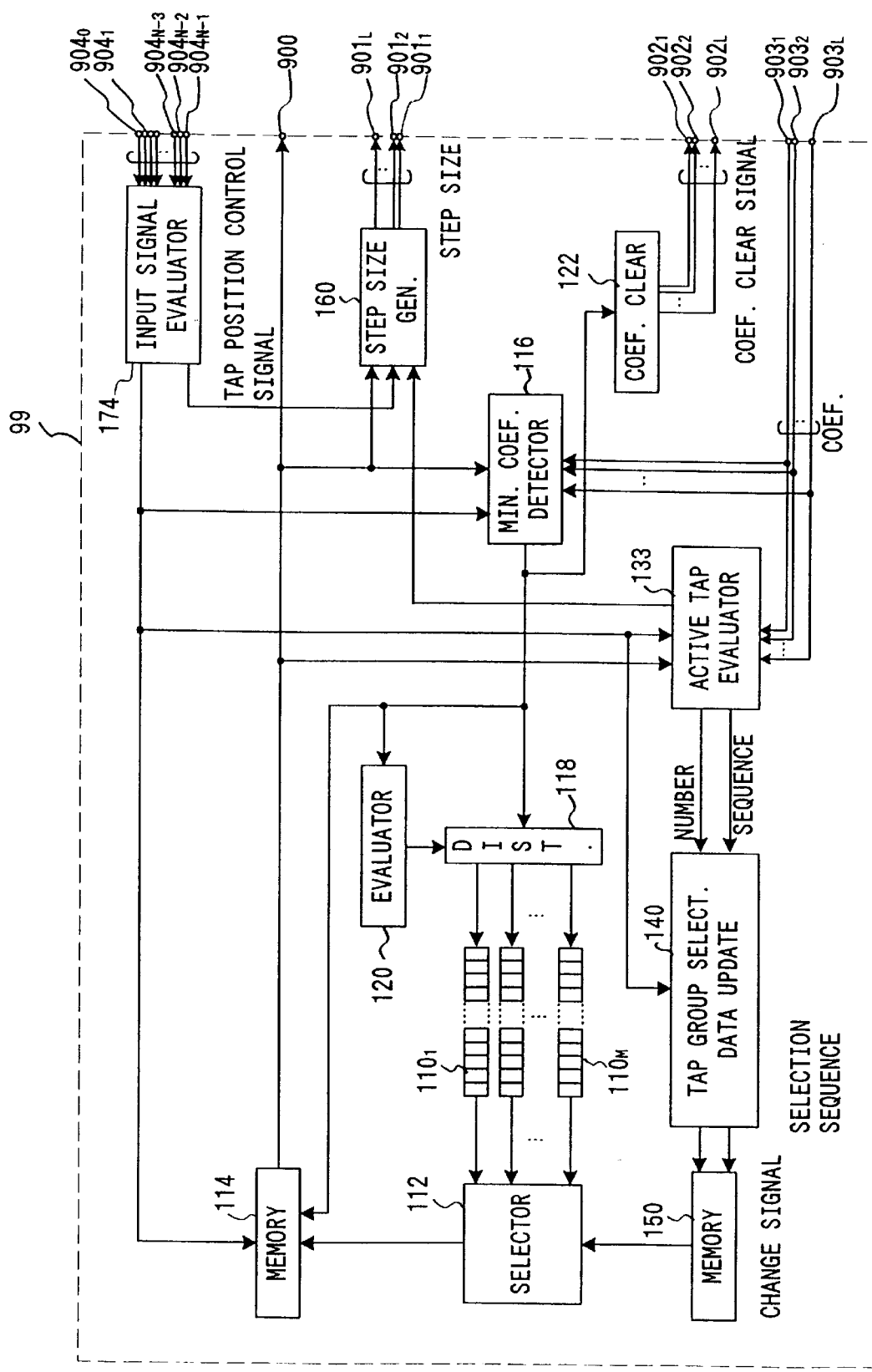
FIG. 15 is a block diagram showing the construction of the tap control circuit 99 in the ninth embodiment.

A ninth embodiment of the invention can be obtained by employing a tap control circuit 99 shown in FIG. 15 in lieu of a tap control circuit 91 in the first embodiment shown in the block diagram of FIG. 1. The ninth embodiment of the invention is different from the first embodiment of the invention only in the tap control circuit. The relation of the tap control circuits 91 and 99 from each other is the relation of the tap control circuits 92 and 98 from each other. This has been described with reference to FIG. 14, and not described.

In the above description of the first to ninth embodiments of the invention, the coefficient evaluation circuit 131, the maximum coefficient detecting circuit 132 and the active tap evaluation circuit 133 were shown and the tap coefficient evaluation circuit 130 and equivalent circuits thereto. The basic operation of these circuits is to receive active tap indexes and corresponding coefficient data from the index memory 114 and the input terminals $903_1$ to $903_L$ and supply the values of the first evaluation index for the tap groups in the order of greater values to the tap group selection data updating circuit 140. Another basic operation of the circuits is to represent the degree of non-uniformity among the values of the second evaluation index for the tap groups as the ratio between the summed values of the second evaluation index for the tap groups or the maximum value at the second evaluation index and the value of the second evaluation index of each tap group and supply the ratio thus obtained to the step size generator 160. In the description so far, the sum of absolute coefficient values, the sum of squared coefficients, the maximum value of absolute coefficient values and the number of active taps were shown as the first and the second evaluation indexes. In addition, these indexes were assumed to be the same. However, it is also possible to use other indexes than the above examples thereof or to make the first and the second indexes different. An example, where the first and the second indexes which are different are used in combination, will now be described.

A tenth embodiment of the invention can be obtained by employing a tap control circuit 100 in lieu of the tap control circuit 92 of the second embodiment shown in the block diagram of FIG. 8. The tenth embodiment is different from the second embodiment of the invention only in the tap control circuit, which will now be described with reference to FIG. 16.

Figure 16:
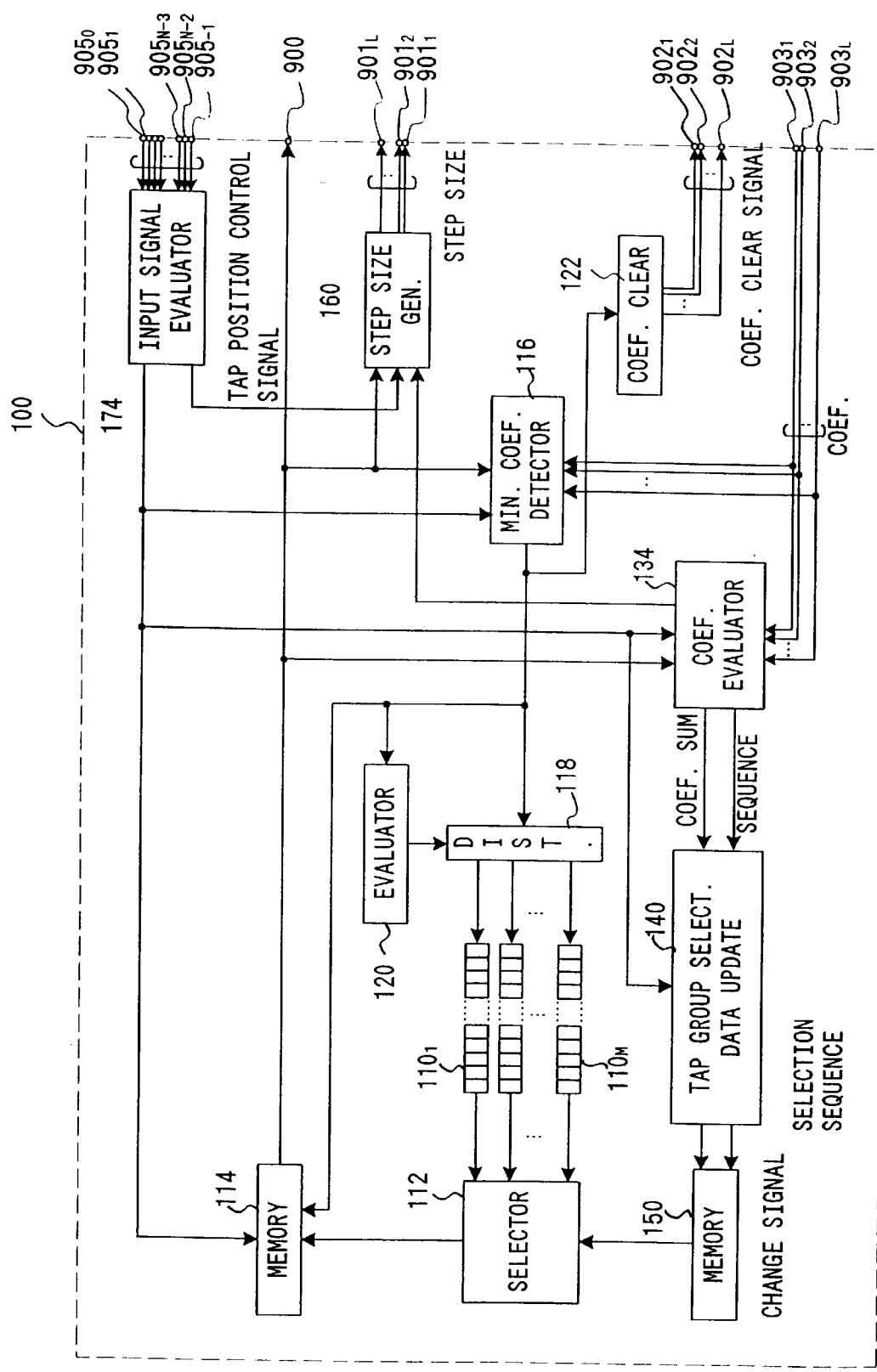
FIG. 16 is a block diagram showing the construction of the tap control circuit 100 in the tenth embodiment.

FIG. 16 is a block diagram showing the construction of the tap control circuit 100. FIG. 16 is the same as the block diagram of FIG. 8 showing the tap control circuit 92 except for the difference between a tap coefficient evaluation circuit 134 and the coefficient evaluation circuit 130. The operation of the embodiment will now be described mainly in connection with the difference. The coefficient evaluation circuit 134 receives the coefficients provided from the coefficient generators and the number of active taps from the index memory, and supplies a "coefficient sum" and an "order" obtained in entirely the same way as in the tap coefficient evaluation circuit 130 to the tap group selection data updating circuit 140. The circuit 134 also calculates the ratio between the maximum value $C_{max}$ among the maximum values of absolute coefficients for each tap group and the maximum value of absolute coefficients for each tap group; for instance, it calculates the ratio $R_j = C_{j,max}/C_{max}$ ($1 \leq j \leq M$) where $C_{j,max}$ is the maximum absolute coefficient value in each tap group in the case where the number of tap groups is M. The circuit 134 supplies the ratio $R_j$ thus obtained to the step size generator 160. The same results can be obtained by defining $C_{max}$ as the sum of the maximum absolute coefficient values of the tap groups.

The above description of the first to tenth embodiments of the invention was made in connection with the same construction where the step size generator 160 generates different step sizes for the respective tap groups. It is also possible to provide the same step size for the tap groups as in an eleventh embodiment of the invention.

Figure 17:
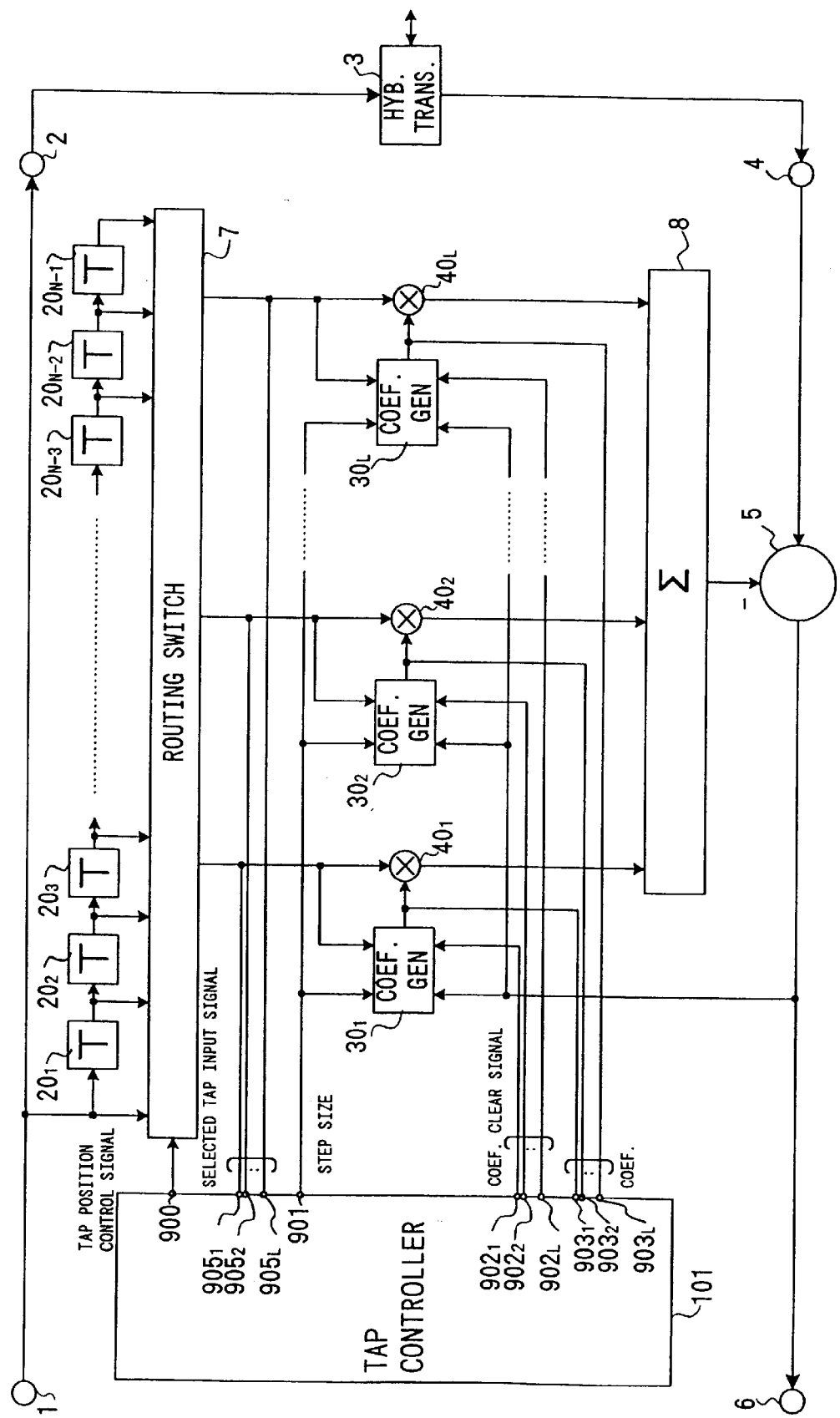
FIG. 17 is a block diagram showing the eleventh embodiment of the invention.

FIG. 17 is a block diagram showing the eleventh embodiment of the invention. The eleventh embodiment is different from the second embodiment in that it employs a tap control circuit 101 in lieu of the tap control circuit 92 shown in FIG. 2. While the tap control circuit 92 supplies different step sizes from the output terminals $901_1$ to $901_L$ to the coefficient generators $30_1$ to $30_L$, the tap control circuit 101 supplies one common step size from the output terminal 901 to the coefficient generators 30, to 30L. This means that the tap control circuit 101 has only the output terminal 901 and does not have the plurality of output terminals $901_1$ to $901_L$.

Figure 18:
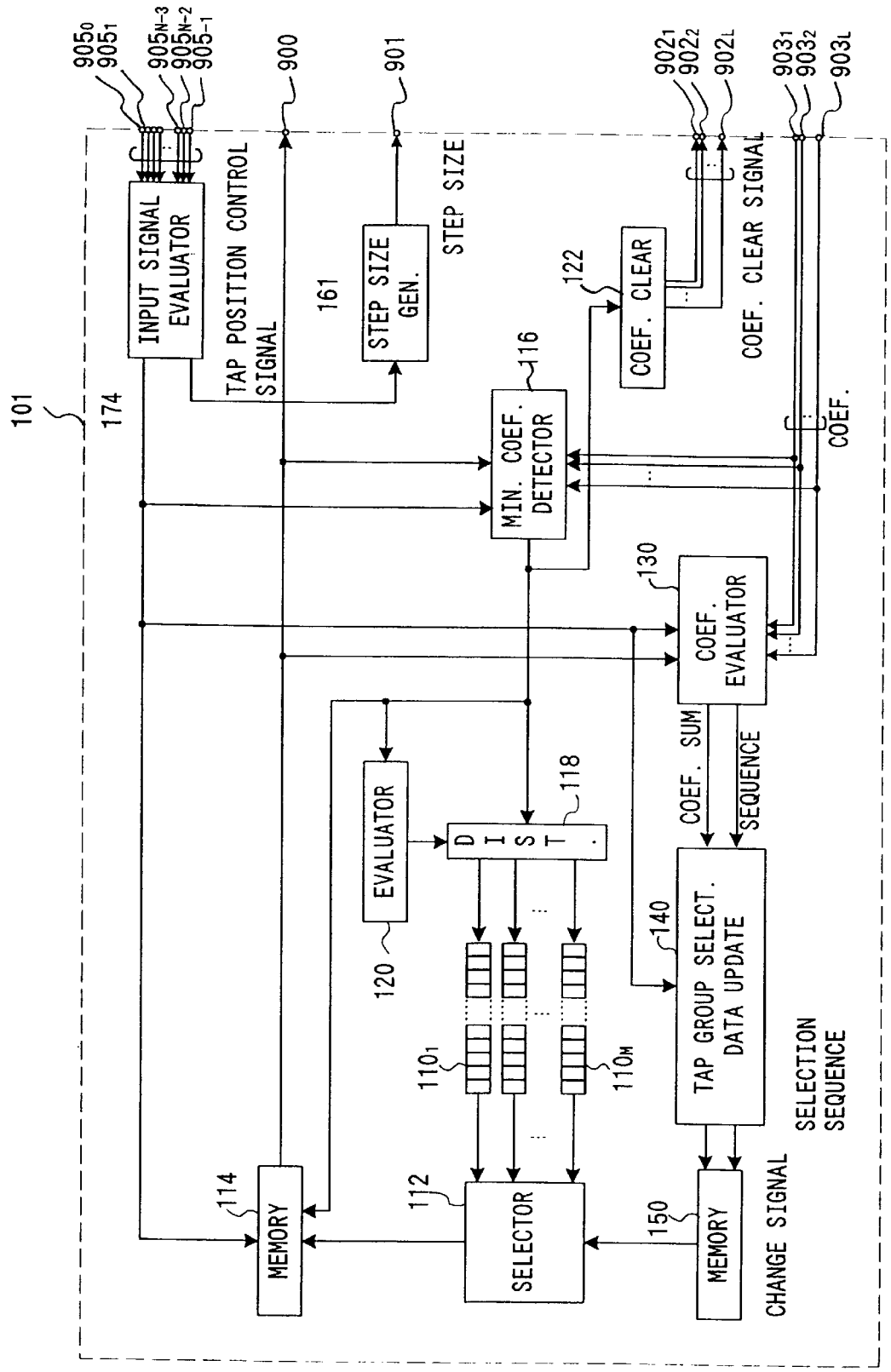
FIG. 18 is a block diagram showing the construction of the tap control circuit 101 in the eleventh embodiment.

FIG. 18 is a block diagram showing the construction of the tap control circuit 101. FIG. 18 is the same as the block diagram of FIG. 8 showing the tap control circuit 92 except for the difference of a step size generator 161 and the step size generator 160 from each other. The operation of the embodiment will now be described mainly in connection with the difference. The step size generator 161, unlike the step size generator 160, receives neither $R_j$ from the coefficient evaluation circuit 130 nor any information on active taps from the index memory 114 and, when and only when a coefficient adaptation stop signal is supplied from the input signal evaluation circuit 174, it sets the step size provided for the output terminal 901 to zero. Otherwise, the step size generator 161 supplies a predetermined value as the step size common to the coefficient generators $30_1$ to $30_L$ from the output terminal 901.

Figure 19:
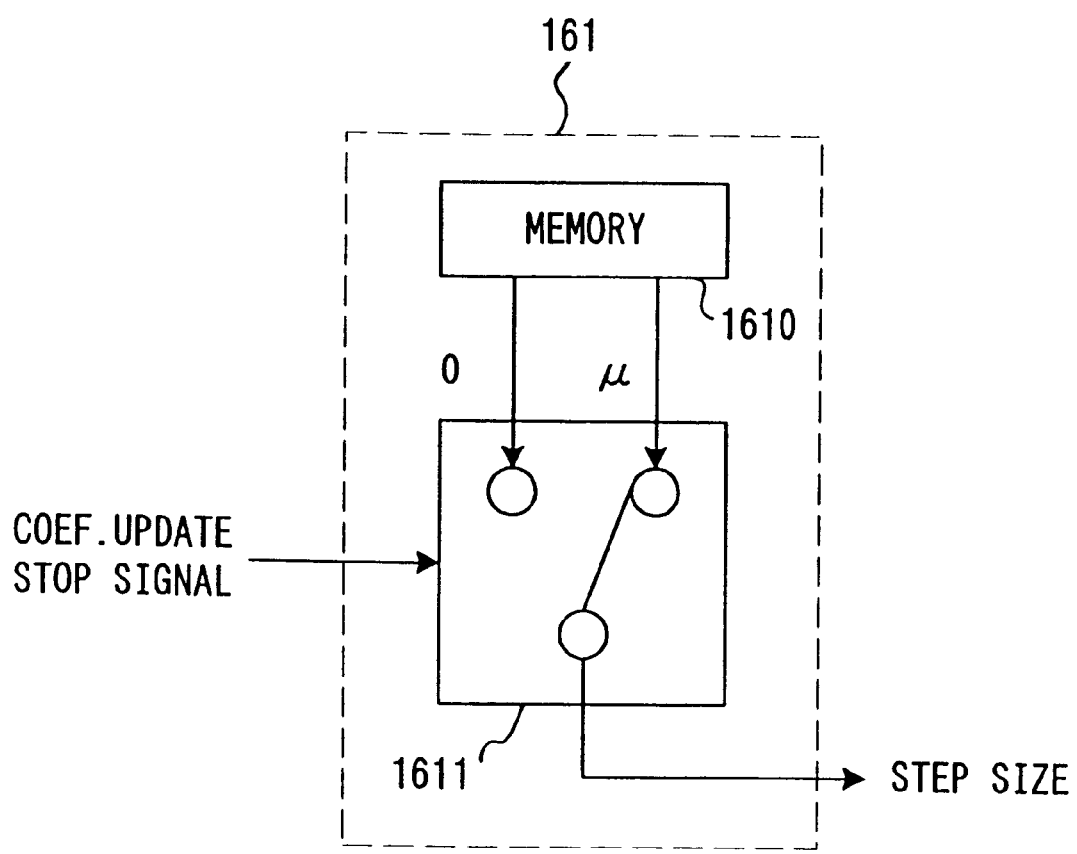
FIG. 19 is a block diagram showing the construction of the step size generator 161 in the eleventh embodiment.

FIG. 19 is a block diagram showing the construction of the step size generator 161. The step size generator 161 includes a memory 1610 and a switch 1611. The memory 1610, in which zero and the normal step size are stored, supplies these data to two input terminals of the switch 1611. The switch 1611 is controlled according to the coefficient adaptation stop signal supplied from the input signal evaluation circuit 174. The switch 1611 normally selects the data supplied from the memory 1610, and provides it as the step size. When the coefficient adaptation stop signal is supplied from the input signal evaluation circuit 174, the switch 1611 selects zero and provides it as the step size.

As is obvious from the above description, it is possible to use any of the input signal evaluation circuits 170 to 173 in lieu of the input signal evaluation circuit 174. It is also possible to use the step size generator 161 for the step size generator 160 in any of the tap control circuits 91 and 93 to 100.

The embodiments of the invention described so far concerned with the LMS algorithm which is used for the coefficient adaptation. However, it is possible to use various other algorithms as well. For example, a twelfth embodiment of the invention may be obtained by using, in lieu of the LMS algorithm, a normalized LMS (NLMS) algorithm which is described in "Adaptive Filters, 1985, Kulwer Academic Publishers, USA (Literature 7).

Specifically, the twelfth embodiment of the invention can be obtained by employing a tap control circuit 102 in lieu of the tap control circuit 92 in the second embodiment shown in the lock diagram of FIG. 7. The twelfth embodiment of the invention is different from the second embodiment of the invention only in the tap control circuit 102, which will now be described with reference to FIG. 20.

Figure 20:
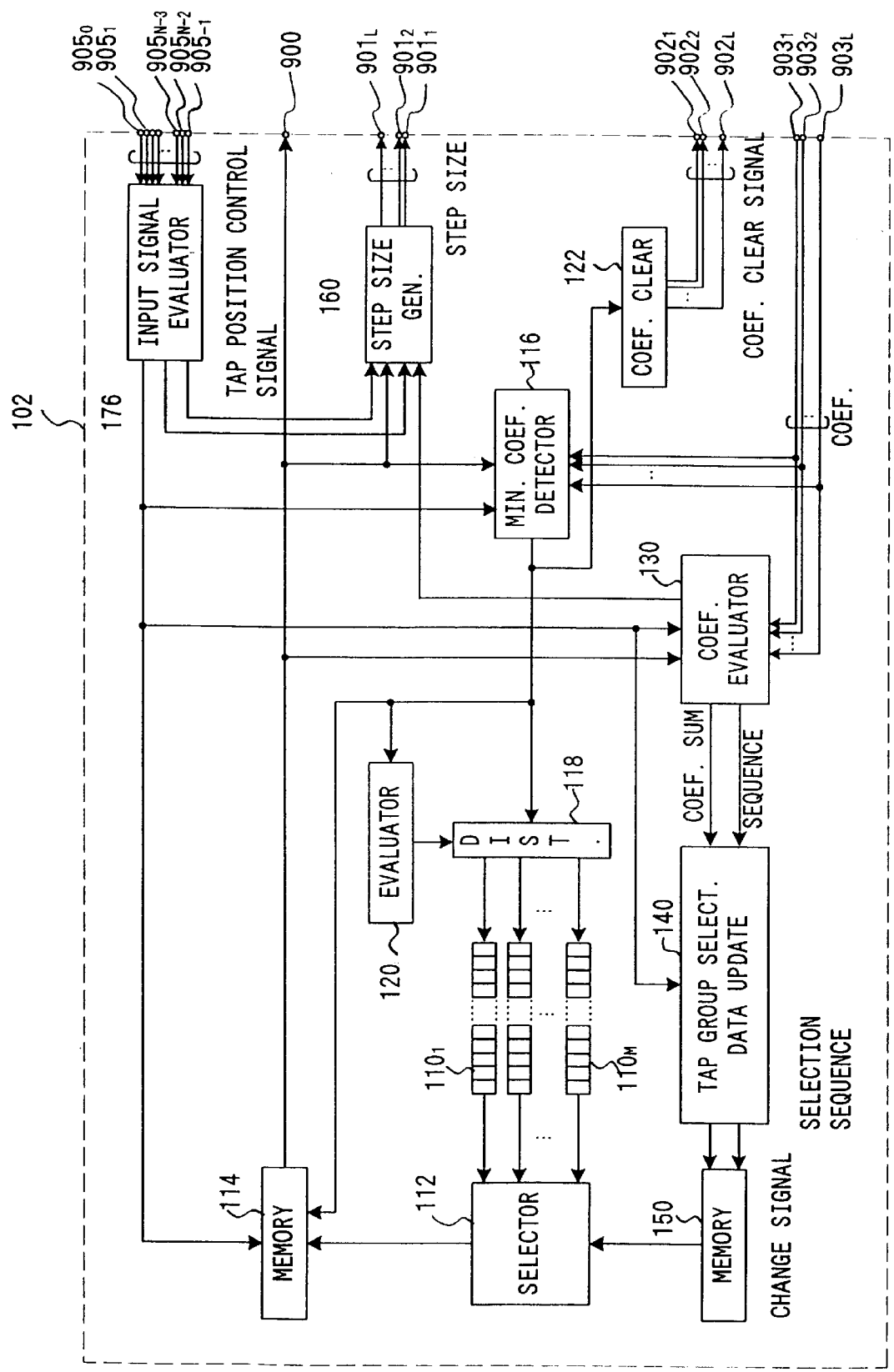
FIG. 20 is a block diagram showing the construction of the tap control circuit 102 in the twelfth embodiment.

FIG. 20 is a block diagram showing the construction of the tap control circuit 102. FIG. 20 is the same as the block diagram of FIG. 9 showing the tap control circuit 92 except for a step size generator 162. The operation of the embodiment will now be described mainly in connection with the difference. The utmost difference of the tap control circuit 102 from the tap control circuit 92 is that input signal power level at active taps is supplied from the input signal evaluation circuit 176 to the step size generator 162. In case of using the NLMS algorithm, the coefficient adaptation is expressed as:

$$Ci(k+1) = Ci(k) + \mu i \cdot \frac{e(k)x(k-a(i))}{\sum_{i=1}^{L} x^2(k-a(i))} \quad (3)$$

where a (i) is a set of active tap indexes as described earlier in connection with the equation (1). It will be seen that the equation (3) is different from the equation (1) representing the LMS algorithm in $$\sum_{i=1}^{L} x^2(k-a(i))$$

which normalizes the second term of the right-hand side. The input signal evaluation circuit 176 calculates the input signal power levels at active taps, and supplies these values to the step size generator 162. The other components in the tap control circuit 102 than the step size generator 162 and the input signal evaluation circuit 178 are entirely the same as and operate in the same way as the other components in the tap control circuit 92 than the step size generator 160 and the input signal evaluation circuit 174, and not described.

Figure 21:
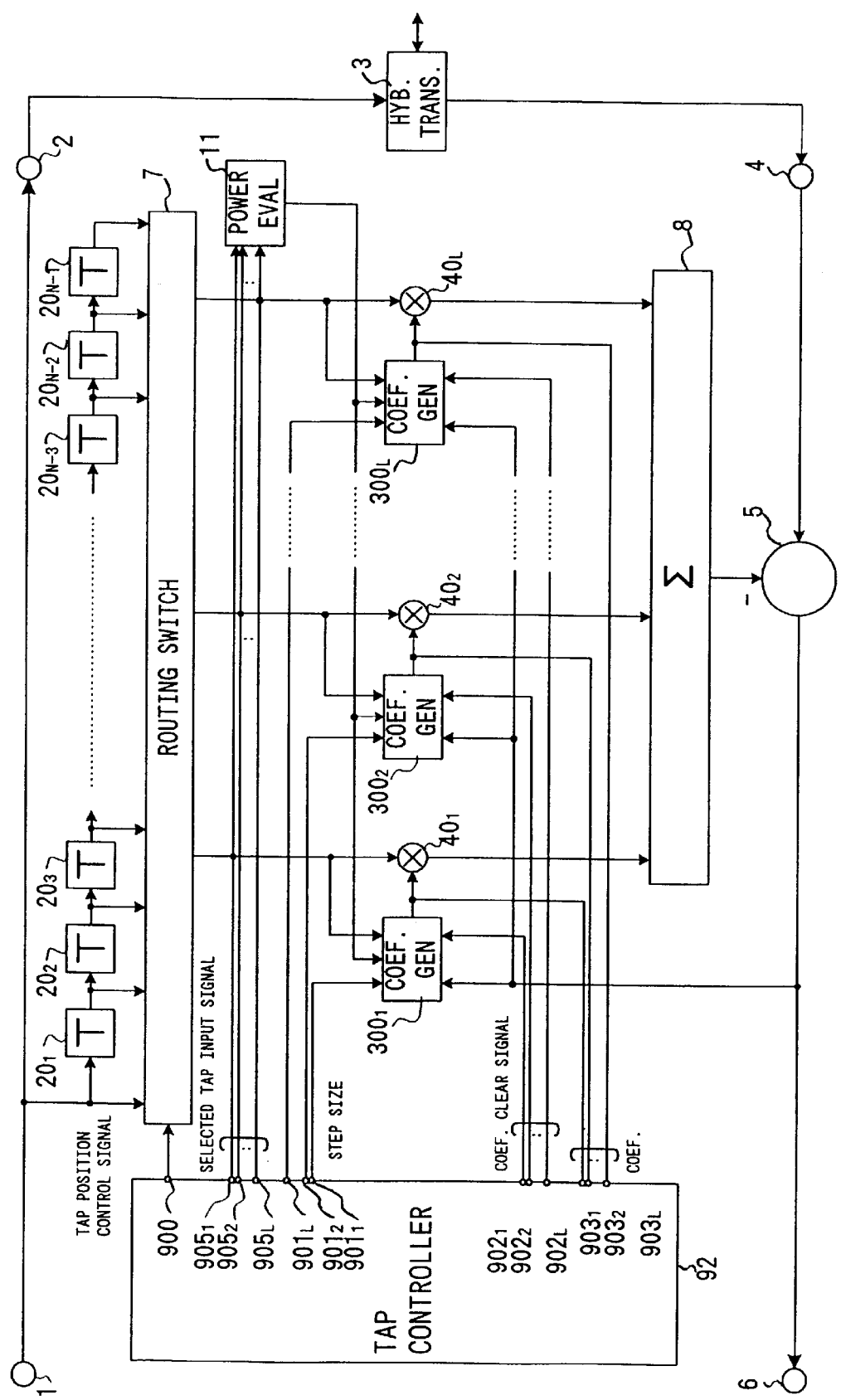
FIG. 21 is a block diagram showing the thirteenth embodiment of the invention.

In the second embodiment of the invention, it is possible to replace the LMS algorithm with the NLMS algorithm without replacing the tap control circuit 92. This arrangement will be described as a thirteenth embodiment of the invention as shown in FIG. 21. The thirteenth embodiment is different from the second embodiment in that coefficient generators $300_1$ to $300_L$ are replaced with the coefficient generators $30_1$ to $30_L$ and that it further comprises a power level evaluation circuit 11. The power level evaluation circuit 11 receives input signal samples to be supplied to the active taps, these signals $$\sum_{i=1}^{L} x^2(k-a(i))$$

being also supplied to the input terminals $905_1$ to $905_L$. The power level evaluation circuit 11 calculates and supplies the inverse of the result of the above calculation as a normalization factor to the coefficient generators $300_1$ to $300_L$.

Figure 22:
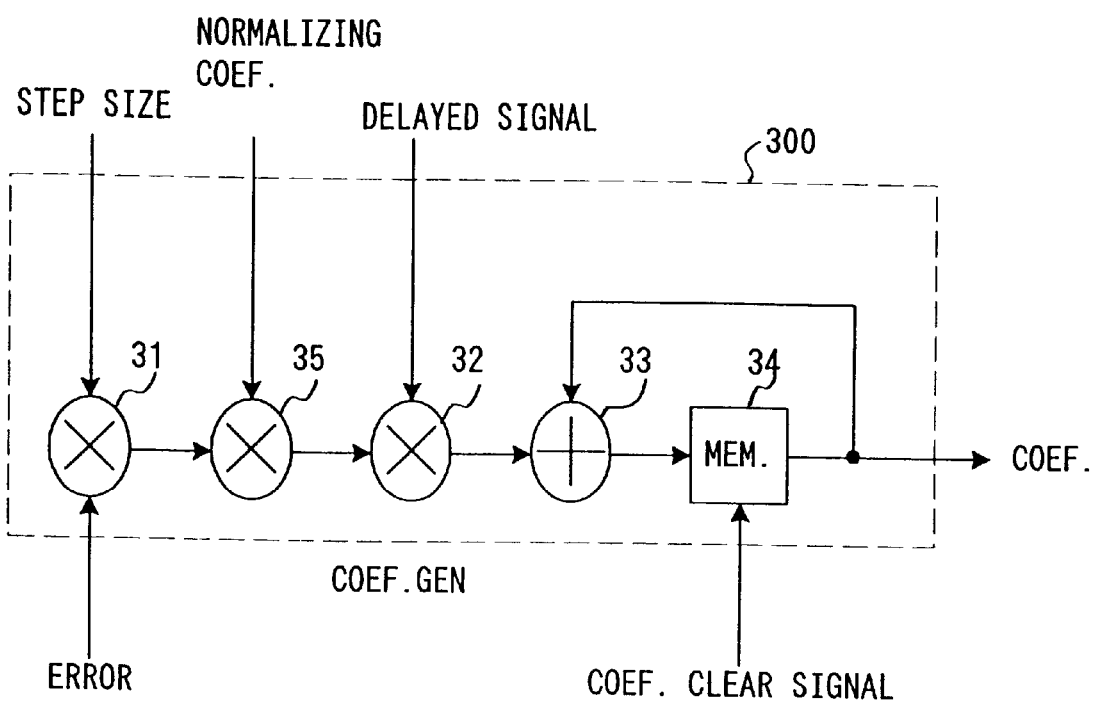
FIG. 22 is a block diagram showing the construction of the tap coefficient generator $300_i$ in the thirteenth embodiment.
Figure 25:
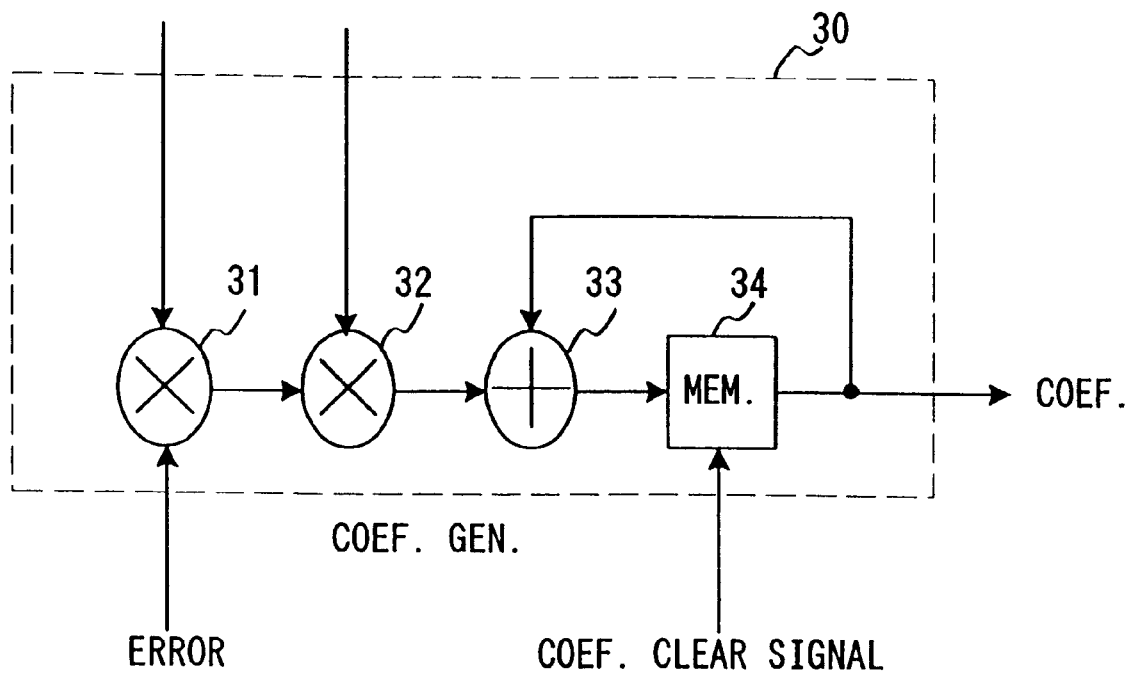
FIG. 25 is a block diagram showing the prior art tap coefficient generators.

FIG. 22 shows the construction of the coefficient generator $300_i$ (i being 1 to L). The coefficient generator $300_i$ is different from the coefficient generator $30_i$ (i being 1 to L) in that the output signal of the multiplier 31 is multiplied by a normalization factor in a multiplier 35, which supplies its output to the multiplier 32. With this difference, the output of the multiplier 32 corresponds to the result of correction of the output of the multiplier 32 shown in FIG. 25 by $$\frac{1}{\sum_{i=1}^{L} x^2(k-a(i))}$$

Thus, the coefficient adaptation equation (3) is realized. The other components in the coefficient generator $300_i$ are the same in construction as and operate in the same way as the tap coefficient generator $30_i$, and not described.

Figure 23:
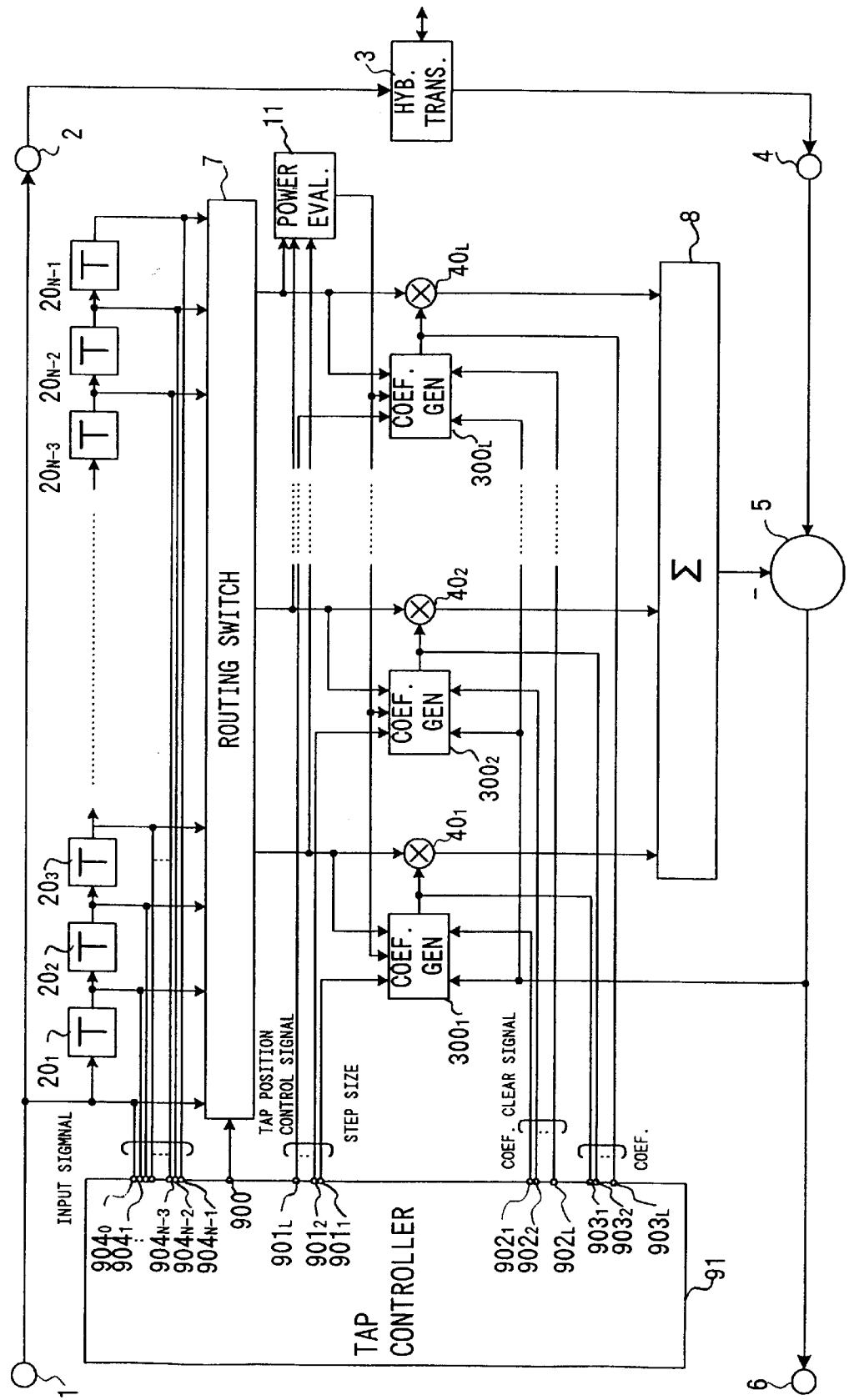
FIG. 23 is a block diagram showing the fourteenth embodiment of the invention.

A fourteenth embodiment of the invention can be obtained by employing the NLMS algorithm in lieu of the LMS algorithm. FIG. 23 is a block diagram showing the fourteenth embodiment of the invention. The fourteenth embodiment is different from the first embodiment in that it employs coefficient generators $300_i$ to $300_L$ in lieu of the coefficient generators $30_1$ to $30_L$ and that it further comprises a power level evaluation circuit 11. The difference of the fourteenth embodiment from the first embodiment is like the difference of the thirteenth embodiment from the third embodiment. This has been described before, and is not mentioned here.

While it has been shown that the coefficient adaptation algorithm in the first and second embodiments of the invention can be changed, a similar change may obviously be made in the fourth to eleventh embodiments of the invention as well. It is further possible to modify the twelfth to fourteenth embodiments of the invention such that a common step size is generated for the tap groups as in the eleventh embodiment of the invention. It is still further possible to use as the adaptive filter algorithm an SRA (sequential regression algorithm) described in Literature 6 and an RLS algorithm described in Literature 7.

The foregoing description of the embodiments is based on the assumption that only a single tap coefficient is rearranged in a single tap control operation, it is also possible to permit rearranging of two or more tap coefficients. Also, while the above embodiments of the invention have concerned with the application thereof to echo cancellers, the invention is also applicable to noise cancellers, hauling cancellers and adaptive equalizers.

The invention has an effect that reduction of the convergence time and the residual error can be trained without causing errors in the values and positions of even when a highly nonstationary signal is received. This is so because input signal samples are evaluated in the input signal evaluation circuit for setting step sizes to zero or stopping the tap position control according to the result of evaluation.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A method of identifying an unknown system identification with adaptive filter comprising the steps of:
   storing, as active tap indexes, tap indexes of active taps provided with tap coefficients used for multiplying and adding operations, among the taps of an adaptive filter,
   arranging tap coefficients for only the active taps,
   storing, as inactive tap indexes in a queue, tap indexes of taps without provision of any tap coefficient used for multiplying or adding operation,
   making, after updating the tap coefficients corresponding to the active tap indexes, the tap indexes of taps provided with tap coefficients of small absolute values to be inactive,
   storing the inactive tap indexes at the end of the queue,
   obtaining, when identifying an unknown system by using the adaptive filter for adaptively controlling tap positions by taking out the inactive tap index at the top of the queue and making the taken-out tap index active,
   evaluation function values corresponding to input signal samples of the adaptive filter, and
   skipping tap coefficient adaptation and adaptive tap position control according to the result of comparison of the obtained evaluation function values with a predetermined threshold value.

2. The method of identifying an unknown system identification with adaptive filter according to claim 1, in which evaluation function values of input signal samples at some of the adaptive filter taps are obtained for stopping the tap coefficient adaptation and adaptive tap position control according to the result of comparison of the obtained evaluation function values with the predetermined threshold value.

3. The method of identifying an unknown system identification with adaptive filter according to claim 1, wherein evaluation function values of input signal samples at the active taps of the adaptive filter are obtained for stopping the tap coefficient adaptation and adaptive tap position control according to the result of comparison of the obtained evaluation function values with the predetermined threshold value.

4. The method of identifying an unknown system identification with adaptive filter according to claim 1, further including the step of obtaining a first evaluation function value for stopping the tap coefficient adaptation according to the result of comparison of the first evaluation function value with a first predetermined threshold value; and
   obtaining a second evaluation function value for stopping the adaptive tap position control according to the result of comparison of the second evaluation function value with a second predetermined threshold value.

5. The method of identifying an unknown system identification with adaptive filter according to claim 1, wherein square value sums are used as the evaluation function values.

6. The method of identifying an unknown system identification according to claim 1, wherein absolute value sums are used as the evaluation function values.

7. The method of identifying an unknown system identification with adaptive filter according to claim 4, wherein square value sums are used as the first evaluation function values.

8. The method of identifying an unknown system identification according to claim 4, wherein absolute value sums are used as the first evaluation function values.

9. The method of identifying an unknown system identification with adaptive filter according to claim 4, wherein square value sums are used as the second evaluation function values.

10. The method of identifying an unknown system identification according to claim 4, wherein absolute value sums are used as the second evaluation function values.

11. A system of identifying an unknown system identification with adaptive filter for making tap coefficient adaptation by using an error signal obtained by subtracting an identifying signal provided from the adaptive filter from the output of the unknown system, comprising a plurality of cascade-connected delay elements for delaying the input signal of the unknown system, a routing switch for selectively passing some of the delayed signals from the delay elements, a plurality of tap coefficient generators for generating tap coefficients by receiving the output signal of the routing switch, the error signal, a tap coefficient-clear signal and step size, a plurality of multipliers for multiplying the tap coefficient values provided from the tap coefficient generators and output signals of the routing switch by one another, an adder for adding together the outputs of the multipliers and thus providing the identifying signal, a subtracter for subtracting the identifying signal from the output of the unknown system and thus obtaining the error signal, and a tap control circuit for generating a tap position control signal for controlling the routing switch, the tap coefficient-clear signal and the step size by receiving the input signal samples, the outputs of the delay elements and the coefficient values provided from the tap coefficient generators, the tap control circuit including an input signal evaluation circuit for setting the step size to zero and also stopping the updating of the tap position control signal according to the input signal samples and evaluation function values corresponding to the outputs of the delay elements.

12. A system of identifying an unknown system identification with adaptive filter for making tap coefficient adaptation by using an error signal obtained by subtracting an identifying signal provided from the adaptive filter from the output of the unknown system, comprising a plurality of cascade-connected delay elements for delaying the input signal of the unknown system, a routing switch for selectively passing some of the delayed signals from the delay elements, a power level evaluation circuit for evaluating the power level of input signal by receiving the output signal of the routing switch, a plurality of tap coefficient generators for generating tap coefficient values by receiving the output signal of the routing switch, an error signal, a tap coefficient-clear signal, step size and the input signal power level, a plurality of multipliers for multiplying the tap coefficient values provided from the tap coefficient generators and output signals of the routing switch by one another, an adder for adding together the outputs of the multipliers and thus providing the identifying signal, a subtracter for subtracting the identifying signal from the output of the unknown system and thus obtaining the error signal, and a tap control circuit for generating a tap position control signal for controlling the routing switch, the tap coefficient-clear signal and the step size by receiving the input signal samples, the outputs of the delay elements and the coefficient values provided from the tap coefficient generators, the tap control circuit including an input signal evaluation circuit for setting the step size to zero and also stopping the updating of the tap position control signal according to the input signal samples and evaluation function values corresponding to the outputs of the delay elements.

13. The system for identifying an unknown system identification with adaptive filter according to claim 11, wherein the tap control circuit includes an input signal evaluation circuit for evaluating some of the input signal samples and the outputs of the delay elements.

14. The system for identifying an unknown system identification with adaptive filter according to claim 11, wherein the tap control circuit generates the tap position control signal, the tap coefficient-clear signal and the step size by receiving the output of the routing switch in lieu of the input sample signals and the outputs of the delay elements.

15. The system for identifying an unknown system identification with adaptive filter according to claim 11, wherein the tap control circuit includes an input signal evaluation circuit for calculating first and second evaluation function values, setting the step size to zero according to the result of comparison of the first evaluation function values with a first predetermined threshold value, and stopping the updating of the tap position control signal according to the result of comparison of the second evaluation function values with a second predetermined threshold value.

16. The system of identifying an unknown system identification with adaptive filter according to one of claims 11, wherein the input signal evaluation circuit includes a plurality of squaring circuits for squaring the input signal samples, and an adder for calculating the sum of the outputs of the squaring circuits, the output of the adder being used as the evaluation function.

17. The system of identifying an unknown system identification according to claim 16, which comprises a plurality of absolute value circuits in lieu of the plurality of squaring circuits.

18. The system of identifying an unknown system identification with adaptive filter according to claim 15, wherein the input signal evaluation circuit includes a plurality of squaring circuits for squaring the input signal samples, and an adder for calculating the sum of the outputs of the squaring circuits, the output of the adder being used as the evaluation function.

19. The system of identifying an unknown system identification according to claim 18, which comprises a plurality of absolute value circuits in lieu of the plurality of squaring circuits.

20. A method of identifying an unknown system with an adaptive filter comprising the steps of:

storing an index to, at least, one tap of the adaptive filter with a coefficient used for generating an output by multiplication with a sample of the input signal as an active tape index in a first queue, and adaptively assigning a limited number of coefficients to active taps, storing indexes to taps which are not used for the multiplication as inactive tap indexes in the second queue, appending, at least, one active tap index having the minimum absolute value to the end of the ;second queue as a new inactive tap index, after coefficient adaptation at the active taps, making, at least, one inactive tap index at the top of the second queue a new active tap index, and evaluating, at least, one sample of the input to the adaptive filter with, at least, one evaluation function, and skipping the coefficient adaptation and the coefficient assignment based on the value of, at least, one evaluation function compared with, at least, one predetermined threshold.

* * * * *